United States Patent
Lee et al.

(10) Patent No.: US 12,471,400 B2
(45) Date of Patent: Nov. 11, 2025

(54) IMAGE SENSOR

(71) Applicant: SAMSUNG ELECTRONICS CO., LTD., Suwon-si (KR)

(72) Inventors: Kyungduck Lee, Hwaseong-si (KR); Seungki Baek, Suwon-si (KR); Kyungho Lee, Suwon-si (KR); Hyuncheol Kim, Suwon-si (KR); Doosik Seol, Suwon-si (KR); Taesub Jung, Hwaseong-si (KR); Masato Fujita, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 823 days.

(21) Appl. No.: 17/443,791

(22) Filed: Jul. 27, 2021

(65) Prior Publication Data

US 2022/0173139 A1 Jun. 2, 2022

(30) Foreign Application Priority Data

Nov. 27, 2020 (KR) .................. 10-2020-0162586

(51) Int. Cl.
*H10F 39/00* (2025.01)
*H10F 39/18* (2025.01)

(52) U.S. Cl.
CPC ......... *H10F 39/807* (2025.01); *H10F 39/182* (2025.01); *H10F 39/8053* (2025.01); *H10F 39/8063* (2025.01)

(58) Field of Classification Search
CPC .................................................. H01L 27/1463
See application file for complete search history.

(56) References Cited

U.S. PATENT DOCUMENTS 7,816,755 B2   10/2010   Yamazaki et al.
9,620,538 B2   4/2017   Lee et al.
(Continued)

FOREIGN PATENT DOCUMENTS

JP   2018201015 A   12/2018
KR   10-2019-0110538 A   9/2019
(Continued)

OTHER PUBLICATIONS

Office Action dated Nov. 11, 2024 issued in Korean Patent Application No. 10-2020-0162586. Note: KR 10-2020-0091195 A cited therein is already of record.

*Primary Examiner* — Ali Naraghi
(74) *Attorney, Agent, or Firm* — Morgan, Lewis & Bockius LLP

(57) ABSTRACT

An image sensor includes: (1) a substrate having first and second surfaces opposing each other in a first direction and a plurality of unit pixels, (2) first and second photodiodes disposed in the substrate in each of the plurality of unit pixels and isolated from each other in a second direction perpendicular to the first direction, (3) a first device isolation film disposed between the plurality of unit pixels, and (4) a pixel internal isolation film disposed in at least one of the plurality of unit pixels. A second device isolation film overlaps at least one of the first and second photodiodes in the first direction. A pair of third device isolation films: (a) extend from the first device isolation film into the unit pixel in a third direction perpendicular to the first direction and the second direction and (b) oppose each other.

20 Claims, 32 Drawing Sheets

(56) References Cited

U.S. PATENT DOCUMENTS

| | | |
|---|---|---|
| 10,249,666 B2 * | 4/2019 | Pyo .................. H10F 39/807 |
| 10,347,679 B2 | 7/2019 | Kato et al. |
| 10,347,688 B2 | 7/2019 | Kim |
| 10,431,619 B2 | 10/2019 | Masagaki et al. |
| 10,461,109 B2 | 10/2019 | Wu et al. |
| 10,700,114 B2 | 6/2020 | Honda et al. |
| 11,195,869 B2 * | 12/2021 | Mi .................. H01L 27/1463 |
| 12,154,926 B2 * | 11/2024 | Lee .................. H10F 39/8057 |
| 2017/0012066 A1 * | 1/2017 | Choi .................. H10F 39/807 |
| 2019/0131328 A1 * | 5/2019 | Kim .................. H10F 39/18 |
| 2020/0013819 A1 | 1/2020 | Toda |
| 2020/0235148 A1 | 7/2020 | Shim |
| 2020/0235149 A1 | 7/2020 | Shiraishi et al. |
| 2021/0134863 A1 * | 5/2021 | Suzuki .................. H10F 39/807 |

FOREIGN PATENT DOCUMENTS

| | | |
|---|---|---|
| KR | 1020200014722 A | 2/2020 |
| KR | 1020200091195 A | 7/2020 |

\* cited by examiner

IMAGE SENSOR

CROSS REFERENCE TO RELATED APPLICATION(S)

This application claims benefit of priority under 35 U.S.C. § 119 to Korean Patent Application No. 10-2020-0162586 filed on Nov. 27, 2020 in the Korean Intellectual Property Office, the disclosure of which is incorporated herein by reference in its entirety.

BACKGROUND

Example embodiments of the present disclosure relate to an image sensor.

An image sensor is a semiconductor-based sensor which may generate an electrical signal by receiving light, and an image sensor may include a pixel array having a plurality of unit pixels and a circuit for driving the pixel array and generating an image. An image sensor may be applied to a digital image processing device such as a camera for obtaining images or videos, and it may be necessary to detect a focus adjustment state of an imaging lens for automatic focus adjustment. Differently from a general digital image processing device including a device for only detecting a focus separately from an image sensor, recently, an autofocusing image sensor using a method of detecting a phase difference has been developed. However, since autofocusing detection ability of an image disposed in a horizontal direction is relatively inaccurate as compared to an autofocusing detection ability for an image disposed in a vertical direction, such an issue may need to be addressed.

SUMMARY

An example embodiment of the present disclosure provides an image sensor including a second device isolation film having an inclined shape between a first photodiode and a second photodiode. The image sensor may improve an autofocusing detection ability of an image disposed in a horizontal direction and may have an improved autofocusing detection ability irrespective of a method of forming a device isolation film.

According to an example embodiment of the present disclosure, an image sensor includes a substrate including a first surface and a second surface opposing each other in a first direction, a plurality of unit pixels arranged in a direction parallel to the first surface, a first photodiode and a second photodiode disposed in the substrate in each of the plurality of unit pixels and configured to be isolated from each other in a second direction perpendicular to the first direction, a first device isolation film disposed between the plurality of unit pixels, and a pixel internal isolation film disposed in at least one of the plurality of unit pixels. The pixel internal isolation film includes a second device isolation film configured to overlap at least one of the first photodiode and the second photodiode in the first direction and a pair of third device isolation films configured to extend from the first device isolation film into the unit pixel in a third direction perpendicular to the first direction and the second direction and to oppose each other.

According to an example embodiment of the present disclosure, an image sensor includes a pixel array including a plurality of pixel groups arranged in a direction parallel to an upper surface of a substrate. Each of the plurality of pixel groups includes a plurality of unit pixels. A logic circuit is configured to obtain a pixel signal from the plurality of unit pixels. The plurality of unit pixels are configured to be isolated from each other by a first device isolation film configured to extend in a first direction perpendicular to an upper surface of the substrate. Each of the plurality of unit pixels includes a first photodiode and a second photodiode configured to be spaced apart from each other in a second direction perpendicular to the first direction. A second device isolation film is configured to overlap at least one of the first photodiode and the second photodiode. A color filter is disposed on a first surface of the substrate. A pixel circuit is disposed on a second surface of the substrate. The plurality of unit pixels included in any one of the plurality of pixel groups includes the color filter of the same color. At least one of the second device isolation films is configured to extend in a fourth direction, intersecting with the second direction and a third direction perpendicular to the first and second directions.

According to an example embodiment of the present disclosure, an image sensor includes a substrate including a first surface and a second surface opposing each other in a first direction. The image sensor includes a plurality of unit pixels arranged in a direction parallel to the first surface, a first photodiode and a second photodiode configured to be spaced apart from each other in a second direction perpendicular to the first direction in the substrate, a first device isolation film disposed between the plurality of unit pixels each including the first photodiode and the second photodiode, and a second device isolation film disposed in at least one of the plurality of unit pixels and configured to overlap a portion of at least one of the first photodiode and the second photodiode in the first direction. The first device isolation film is configured to extend from the second surface to the first surface. The second device isolation film is configured to extend from the first surface and to be isolated from the second surface.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
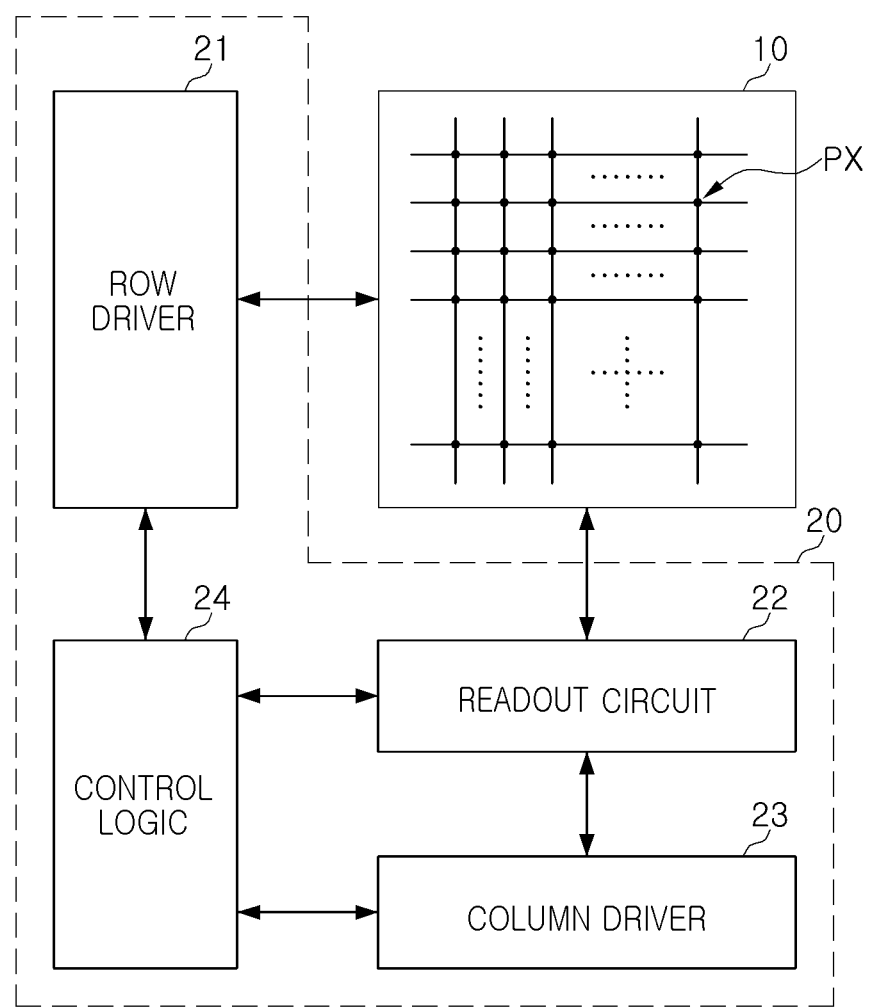
FIG. 1 is a block diagram illustrating an image sensor according to an example embodiment of the present disclosure.

FIG. 1 is a block diagram illustrating an image sensor according to an example embodiment.

Referring to FIG. 1, an image sensor 1 in an example embodiment may include a pixel array 10 and a logic circuit 20.

The pixel array 10 may include a plurality of unit pixels PX disposed in an array form along a plurality of rows and a plurality of columns. Each of the unit pixels PX may include at least one photoelectric conversion device configured to generate electrical charges in response to light and a pixel circuit configured to generate a pixel signal corresponding to electrical charges generated by the photoelectric conversion device.

The photoelectric conversion device may include a photodiode formed of a semiconductor material and/or an organic photodiode formed of an organic material. In an example embodiment, each of the unit pixels PX may include two or more photoelectric conversion devices and the two or more photoelectric conversion devices included in a single unit pixel PX may generate electrical charges by receiving light of different colors.

In an example embodiment, each of the unit pixels PX may include a first photodiode and a second photodiode and the first photodiode and the second photodiode may generate electrical charges by receiving light of different wavelength bands.

According to an example embodiment, the pixel circuit may include a transfer transistor, a drive transistor, a select transistor, and a reset transistor. When each of the unit pixels PX has two or more photoelectric conversion devices, each of the unit pixels PX may include a pixel circuit for processing electrical charges generated by each of two or more photoelectric conversion devices. In other words, when each of the unit pixels PX has two or more photoelectric devices, the pixel circuit may include two or more of at least one of a transfer transistor, a drive transistor, a select transistor, and a reset transistor.

The logic circuit 20 may include circuits for controlling the pixel array 10. For example, the logic circuit 20 may include a row driver 21, a readout circuit 22, a column driver 23, and a control logic 24.

The row driver 21 may drive the pixel array 10 by a row unit. For example, the row driver 21 may generate a transmission control signal for controlling the transfer transistor of a pixel circuit, a reset control signal for controlling the reset transistor, and a selection control signal for controlling the select transistor, and may input the signals to the pixel array 10 by a row unit.

The readout circuit 22 may include a correlated double sampler (CDS) and an analog-to-digital converter (ADC). The correlated double samplers may be connected to the unit pixels PX through column lines. The correlated double samplers may perform correlated double sampling by receiving a pixel signal from the unit pixels PX connected to a row line selected by a row line selection signal of the row driver 21. The pixel signal may be received through the column lines. The analog-to-digital converter may convert the pixel signal detected by the correlated double sampler into a digital pixel signal and may transmit the signal to the column driver 23.

The column driver 23 may include a latch or a buffer circuit for temporarily storing a digital pixel signal and an amplifier circuit and may process a digital pixel signal received from the readout circuit 22. The row driver 21, the readout circuit 22 and the column driver 23 may be controlled by the control logic 24. The control logic 24 may include a timing controller for controlling operation timings of the row driver 21, the readout circuit 22, and the column driver 23.

Among the unit pixels PX, unit pixels PX disposed in the same position in a horizontal direction may share the same column line. For example, unit pixels PX disposed in the same position in a vertical direction may be simultaneously selected by the row driver 21 and may output pixel signals through column lines. In an example embodiment, the readout circuit 22 may simultaneously obtain a pixel signal from the unit pixels PX selected by the row driver 21 through column lines. The pixel signal may include a reset voltage and a pixel voltage, and the pixel voltage may be obtained by reflecting electrical charges generated by each of the unit pixels PX in response to light within the reset voltage.

Figure 2:
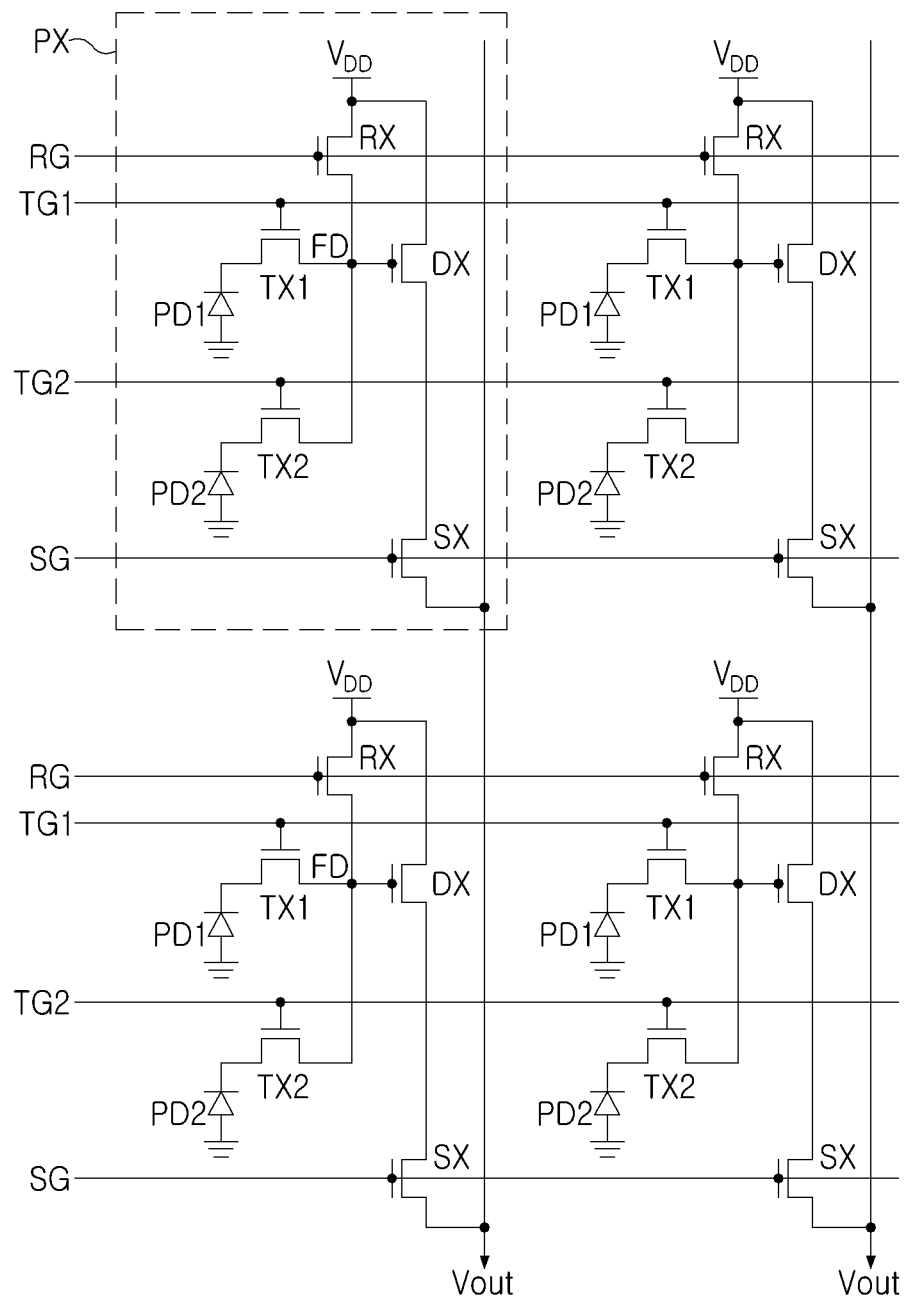
FIG. 2 is a circuit diagram illustrating a pixel array included in an image sensor according to an example embodiment of the present disclosure.

FIG. 2 is a circuit diagram illustrating a pixel array included in an image sensor according to an example embodiment.

Referring to FIG. 2, a pixel array 10 included in an image sensor 1 in an example embodiment may include a plurality of unit pixels PX, and the unit pixels PX may be arranged in a matrix form in row and column directions. Each of the unit pixels PX may include a first photodiode PD1 and a second photodiode PD2 and may further include a first pixel circuit for processing electrical charges generated by the first photodiode PD1 and a second pixel circuit for processing electrical charges generated by the second photodiode PD2. The first pixel circuit may include a plurality of first semiconductor devices, and the second pixel circuit may include a plurality of second semiconductor devices.

The image sensor 1 in an example embodiment may provide an autofocusing function using the first photodiode PD1 and the second photodiode PD2 isolated from each other by a pixel internal isolation film based on the pixel circuit illustrated in FIG. 2. However, the pixel circuit of the unit pixel providing the autofocusing function is not limited to the example illustrated in FIG. 2, and some elements may be added or may not be provided if desired.

The first pixel circuit may include a first transfer transistor TX1, a reset transistor RX, a select transistor SX, and a drive transistor DX. The second pixel circuit may include a second transfer transistor TX2, a reset transistor RX, a select transistor SX, and a drive transistor DX. As illustrated in FIG. 2, the first pixel circuit and the second pixel circuit may share a reset transistor RX, a select transistor SX, and a drive transistor DX. However, an example embodiment thereof is not limited to the example in FIG. 2 and the first and second pixel circuits may be configured in various manners. Gate electrodes of the first and second transfer transistors TX1 and TX2, the reset transistor RX, and the select transistor SX may be connected to the driving signal lines TG1, TG2, RG, and SG, respectively.

In an example embodiment, the first pixel circuit may generate a first electrical signal from electrical charges generated by the first photodiode PD1 and may output the signal to a first column line and the second pixel circuit may generate a second electrical signal from electrical charges generated by the second photodiode PD2 and may output the signal to a second column line. According to an example embodiment, two or more first pixel circuits disposed adjacent to each other may share a single first column line. Similarly, two or more second pixel circuits disposed adjacent to each other may share a single second column line. The second pixel circuits disposed adjacent to each other may share a part of the second semiconductor devices.

The first transfer transistor TX1 may be connected to a first transfer gate TG1 and the first photodiode PD1, and the second transfer transistor TX2 may be connected to a second transfer gate TG2 and the second photodiode PD2. The first and second transmission transistors TX1 and TX2 may share a floating diffusion region FD. The first and second photodiodes PD1 and PD2 may generate and accumulate electrical charges in proportion to the amount of light incident from the outside. The first and second transfer transistors TX1 and TX2 may sequentially transfer electrical charges accumulated in the first and second photodiodes PD1 and PD2 to the floating diffusion region FD. To transfer electrical charges generated by one of the first and second photodiodes PD1 and PD2 to the floating diffusion region FD, signals complementary to each other may be applied to the first and second transfer gates TG1 and TG2. Accordingly, the floating diffusion region FD may accumulate electrical charges generated by one of the first and second photodiodes PD1 and PD2.

The reset transistor RX may periodically reset electrical charges accumulated in the floating diffusion region FD. For example, electrodes of the reset transistor RX may be connected to the floating diffusion region FD and the power voltage VDD. When the reset transistor RX is turned on, electrical charges accumulated in the floating diffusion region FD may be discharged due to a potential difference from the power supply voltage VDD, the floating diffusion region FD may be reset, and a voltage of the floating diffusion region FD may be equalized to the power voltage VDD.

Operation of the drive transistor DX may be controlled according to the amount of electrical charges accumulated in the floating diffusion region FD. The drive transistor DX may be combined with a current source disposed externally of the unit pixel PX and may work as a source follower buffer amplifier. For example, a potential change caused by accumulation of electrical charges in the floating diffusion region FD may be amplified and may be output to an output line Vout.

The select transistor SX may select unit pixels PX to be read by row units. When the select transistor SX is turned on, an electrical signal output by the drive transistor DX may be transmitted to the select transistor SX.

The logic circuit 20 may provide an autofocusing function using the first pixel signal obtained after the first transfer transistor TX1 is turned on and the second pixel signal obtained after the second transfer transistor TX2 is turned on.

Figure 3:
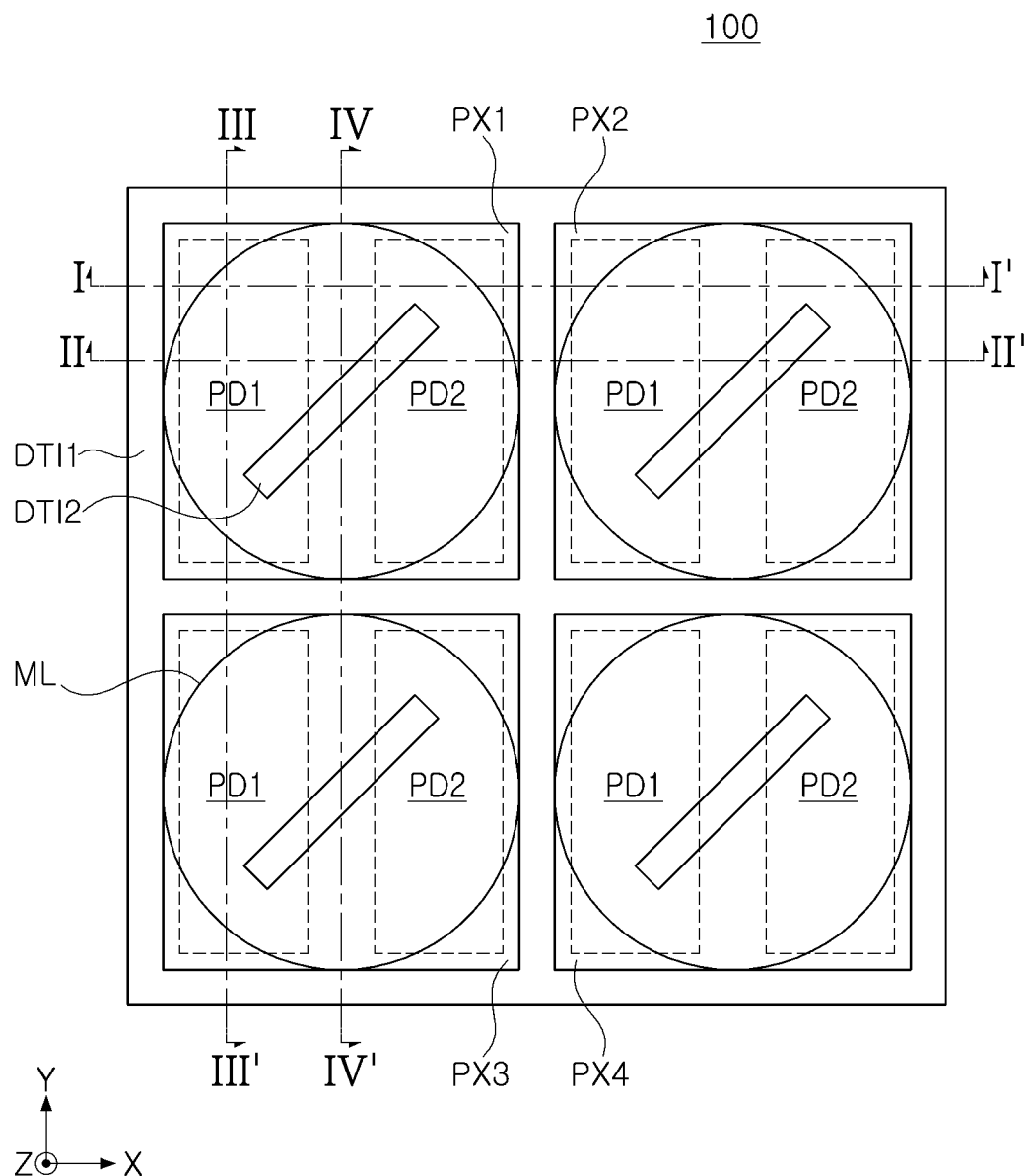
FIG. 3 is a diagram illustrating an image sensor, viewed from above, according to an example embodiment of the present disclosure.

FIG. 3 is a diagram illustrating an image sensor, viewed from above, according to an example embodiment.

Referring to FIG. 3, the image sensor 100 in an example embodiment may include first and second photodiodes PD1 and PD2, a first device isolation film DTI1 disposed among a plurality of pixels PX1, PX2, PX3, and PX4, a second device isolation film DTI2 disposed in each of the plurality of pixels PX1, PX2, PX3, and PX4, and a microlens ML.

Generally, an image sensor in which a single unit pixel includes two photodiodes may have a lower ability to detect a horizontal pattern as compared to an ability to detect a vertical pattern. In other words, autofocusing performance in the horizontal pattern direction of the image sensor may become an issue.

To address the above issue, the image sensor 100 in an example embodiment may, when external light is incident through the microlens ML, divide the incident light and may detect a phase difference of two portions of light in positions in the same distance. For example, the phase difference between the two portions of light may correspond to a phase difference in the horizontal pattern direction. The image sensor 100 in an example embodiment may perform an autofocusing operation by moving the microlens ML based on a detection result. In other words, by dividing external light, the autofocusing performance in the vertical pattern direction may be maintained, and the issue in the autofocusing performance in the horizontal pattern direction may be addressed.

The image sensor 100 in an example embodiment may include a second device isolation film DTI2 disposed in each of the plurality of pixels PX1, PX2, PX3, and PX4 to divide light incident through the microlens ML.

The microlens ML may be disposed in an uppermost portion of each of the plurality of pixels PX1, PX2, PX3, and PX4 in a first direction (e.g., z direction) and may allow external light to be incident thereto. For example, the first and second photodiodes PD1 and PD2 may be isolated from each other in a second direction (e.g., x direction) in each of the plurality of pixels PX1, PX2, PX3, and PX4. The first device isolation film DTI1 may isolate the plurality of pixels PX1, PX2, PX3, and PX4 from each other and may define a unit pixel. The second device isolation film DTI2 may extend in a direction intersecting with a second direction and a third direction (e.g., y direction) perpendicular to the first direction and the second direction, and the second device isolation film DTI2 may overlap a portion of at least one of the first and second photodiodes PD1 and PD2 in the first direction. For example, as the second device isolation film DTI2 divides the light incident through the microlens ML and provides the divided portions of light to the first photodiode PD1 and the second photodiode PD2, the autofocusing performance in the vertical pattern direction may be maintained and the issue in the autofocusing performance in the horizontal pattern direction may be addressed.

FIGS. 4, 5, 6, 7, 8, 9, 10, and 11 are cross-sectional diagrams illustrating an image sensor according to an example embodiment.

Figure 4:
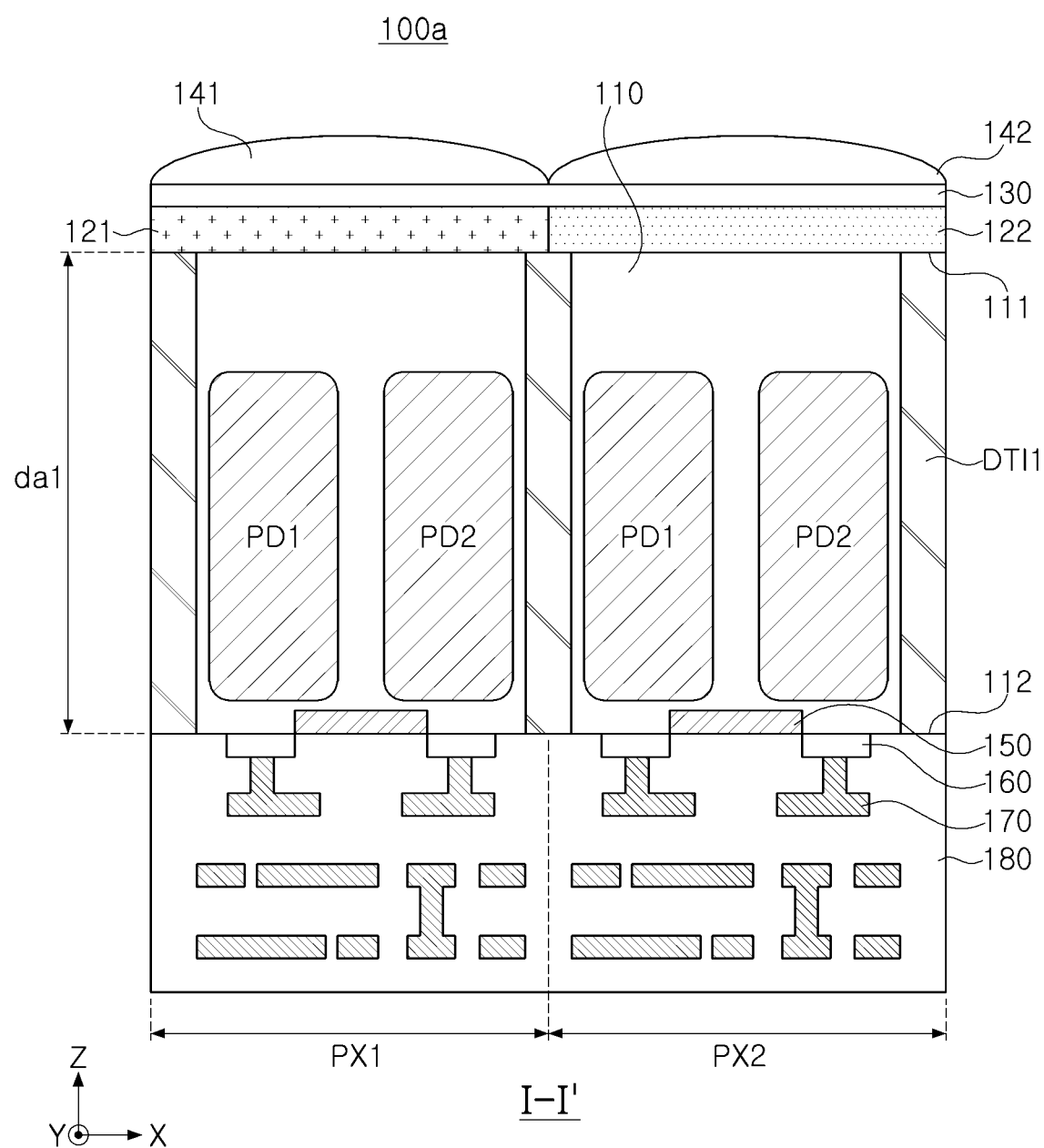
FIGS. 4, 5, 6, 7, 8, 9, 10, and 11 are cross-sectional diagrams illustrating an image sensor according to an example embodiment of the present disclosure.
Figure 5:
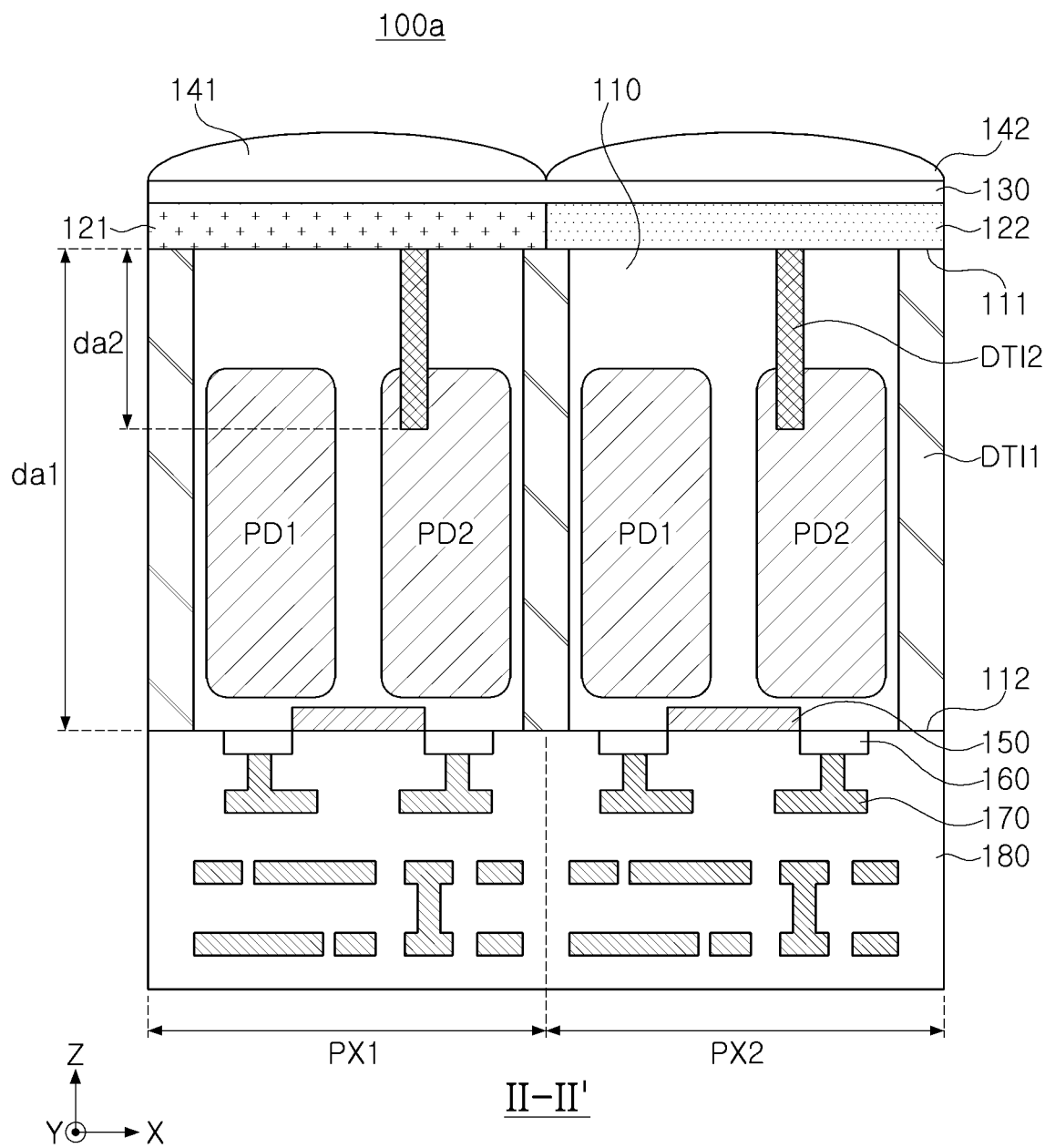
Figure 6:
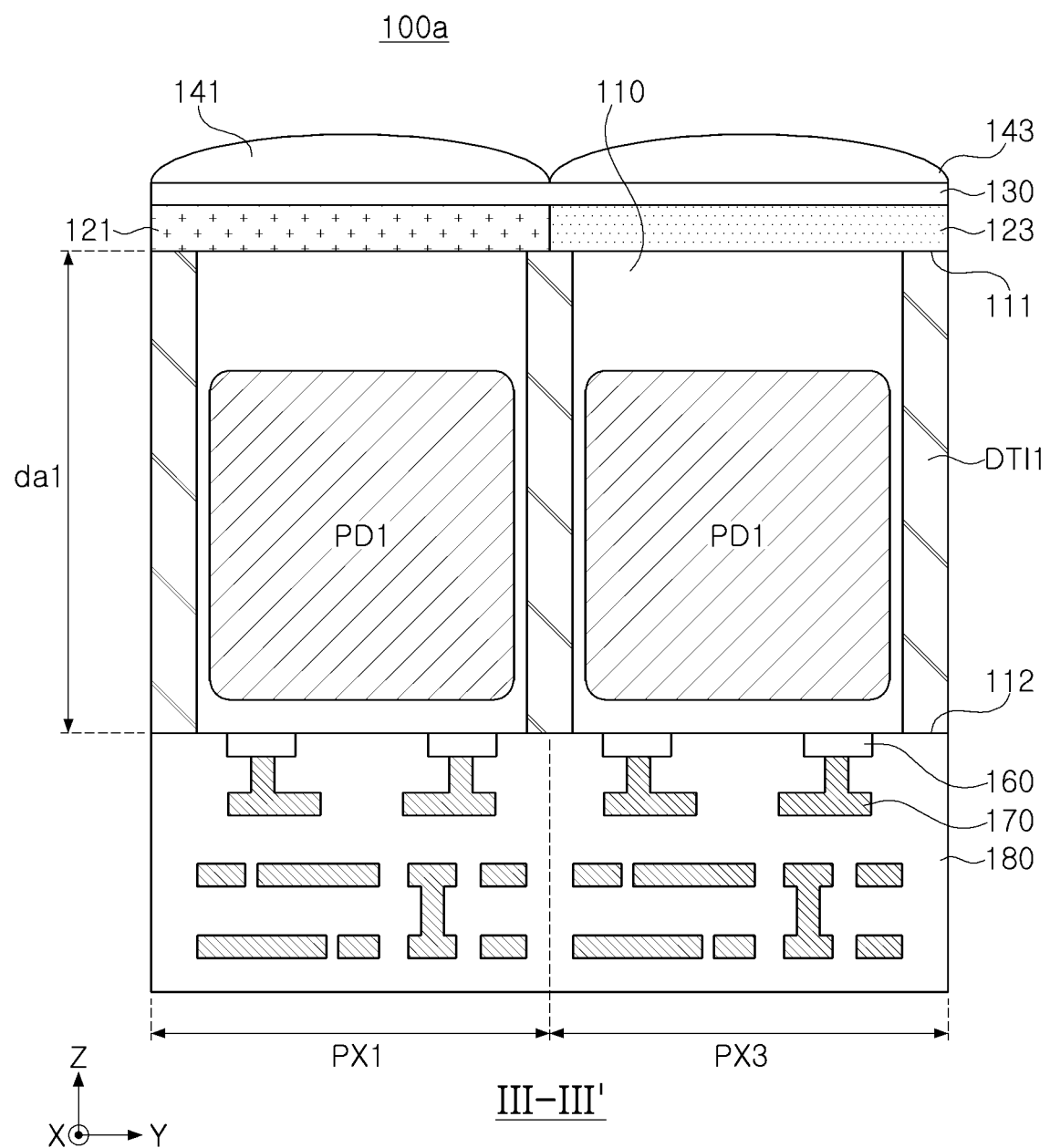
Figure 8:
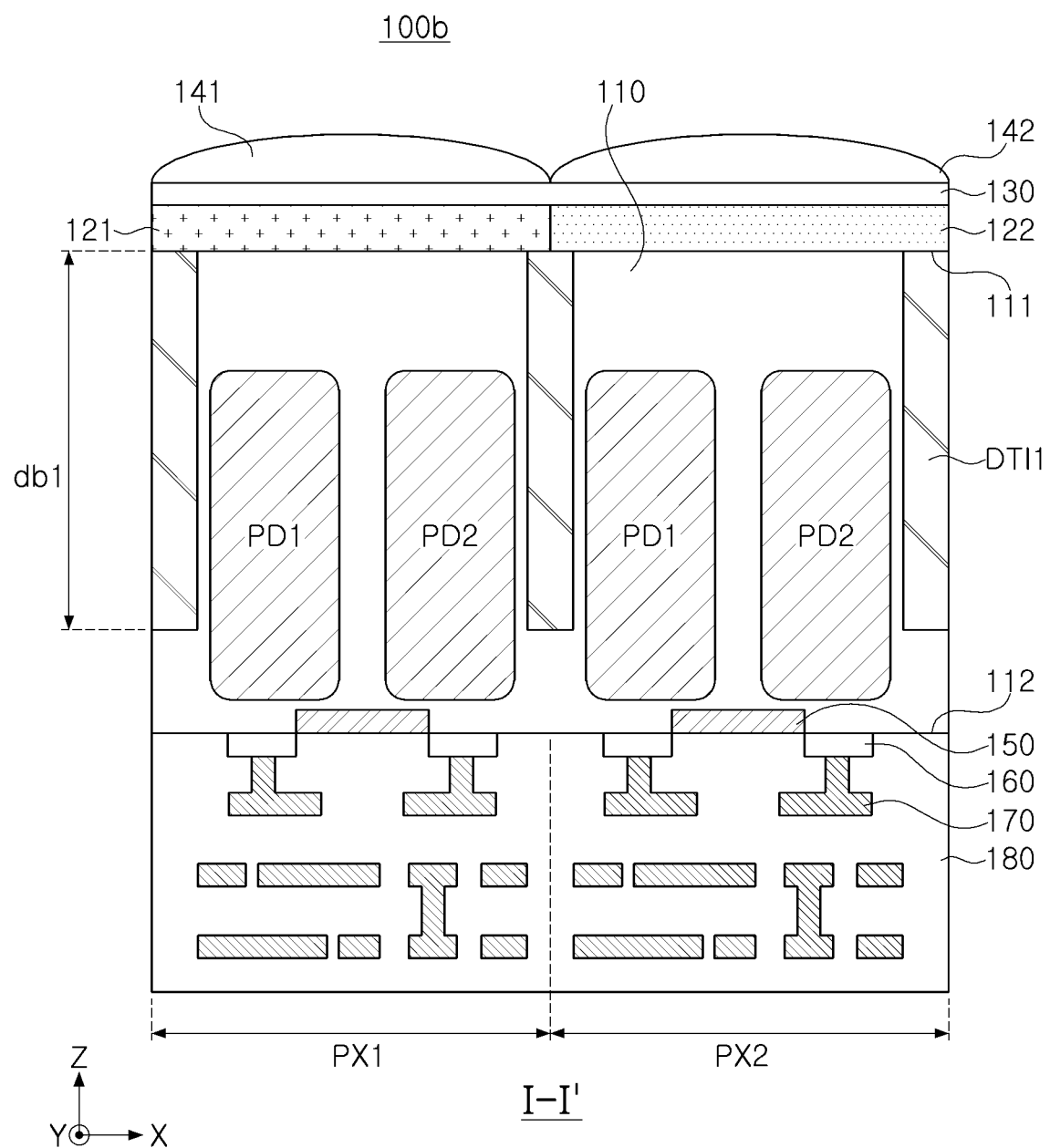
Figure 9:
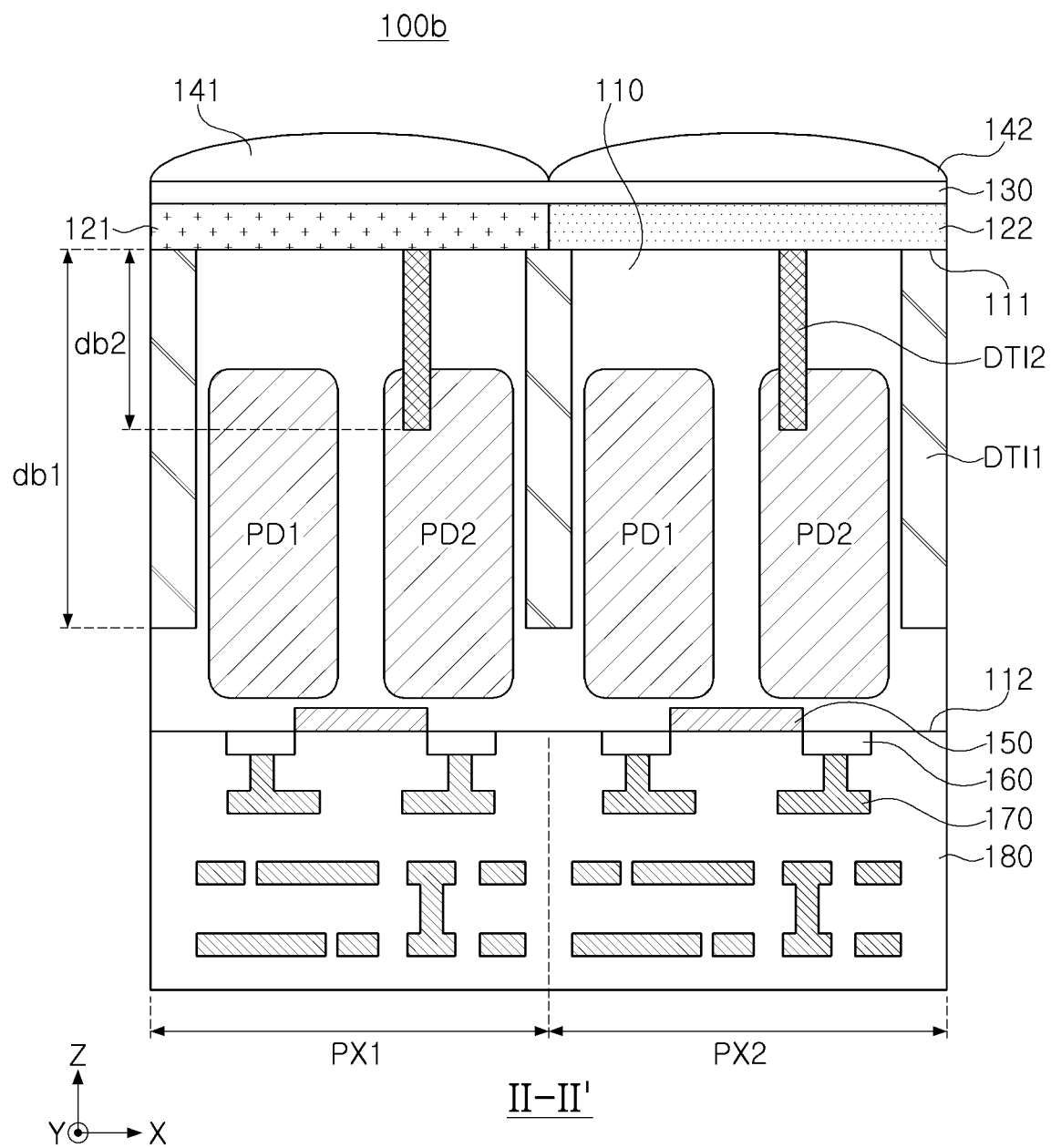
Figure 10:
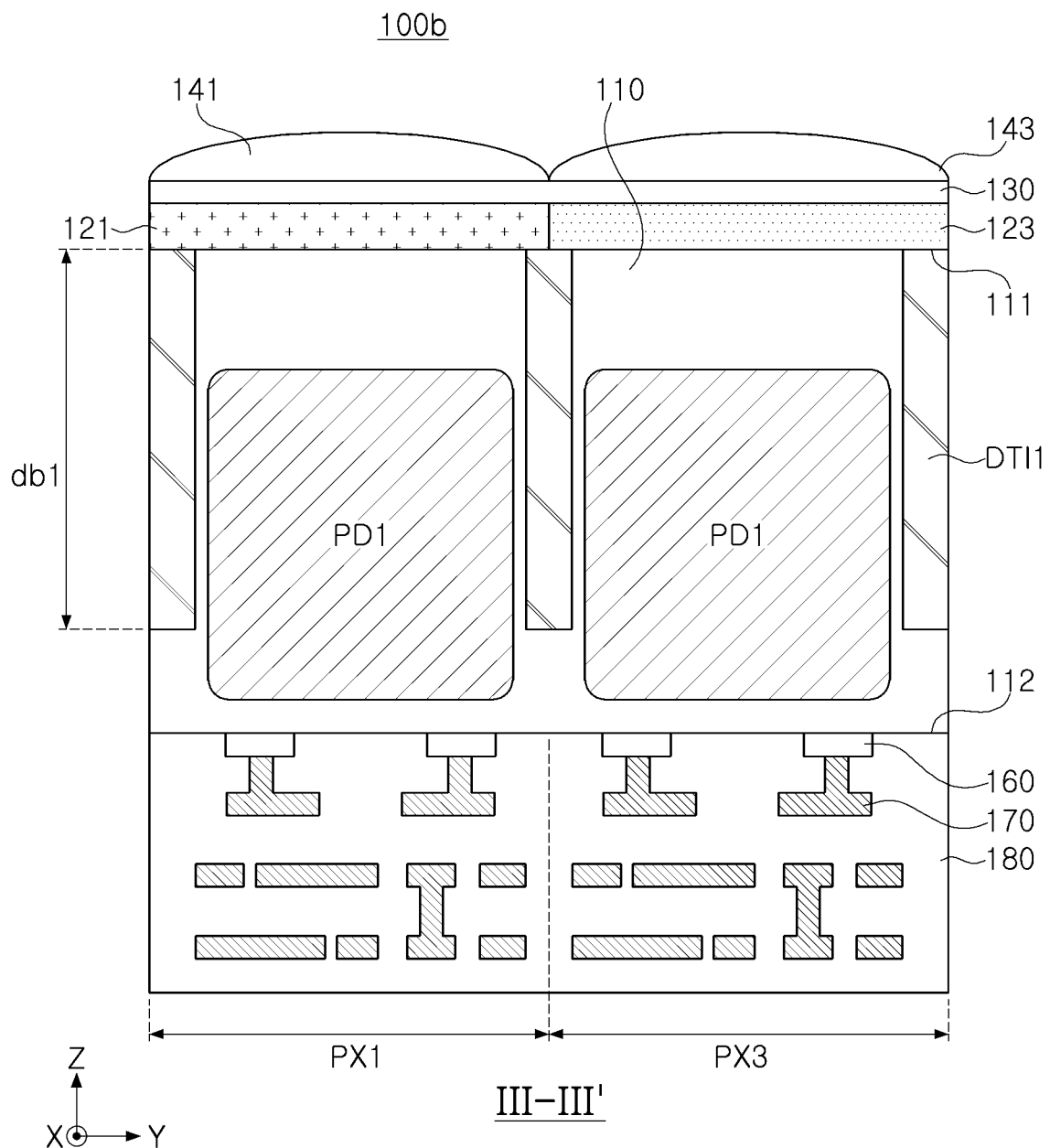

FIGS. 4, 5, 6, 7, 8, 9, 10, and 11 are cross-sectional diagrams illustrating an image sensor 100 taken along lines one of lines I-I' to IV-IV'. For example, FIGS. 4 and 8 may be cross-sectional diagrams taken along line I-I' in FIG. 3, and FIGS. 5 and 9 may be cross-sectional diagrams taken along line II-II' in FIG. 3. FIGS. 6 and 10 may be cross-sectional diagrams taken along line III-III' in FIG. 3, and FIGS. 7 and 11 may be cross-sectional diagrams taken along line IV-IV' in FIG. 3.

Each of an image sensor 100a illustrated in FIGS. 4, 5, 6, and 7, and an image sensor 100b illustrated in FIGS. 8, 9, 10, and 11 may include first device isolation films DTI1 extending in different manners. Accordingly, the first device isolation films DTI1 included in the image sensor 100a and the image sensor 100b may have different structures. Elements other than the first device isolation films DTI1 included in the image sensors 100a and 100b in the example embodiments may be the same. However, the image sensors 100a and 100b illustrated in FIGS. 4, 5, 6, 7, 8, 9, 10, and 11 are merely example embodiments and an example embodiment thereof is not limited thereto, and some elements may be added or may not be provided if desired.

Referring to FIGS. 4, 5, 6, and 7, the image sensor 100a in the example embodiments may include a substrate 110 including a first surface 111 and a second surface 112 opposing each other, a first device isolation film DTI1 disposed between a plurality of pixels PX1, PX2, PX3, and PX4 in the substrate 110, and a second device isolation film DTI2 disposed in at least one of the plurality of pixels PX1, PX2, PX3, and PX4. For example, the plurality of pixels PX1, PX2, PX3, and PX4 may be arranged in a direction parallel to the first surface 111. For example, the first device isolation film DTI1 and the second device isolation film DTI2 may extend in a first direction (e.g., z direction) within the substrate 110 including a semiconductor material. For example, the second device isolation film DTI2 may extend in a direction intersecting with the second direction and the third direction to improve an autofocusing performance in a horizontal pattern direction of incident light. The second device isolation film DTI2 may overlap a portion of at least one of the first photodiode PD1 and the second photodiode PD2 in the first direction.

In the image sensor 100a in the example embodiments, each of the plurality of pixels PX1, PX2, PX3, and PX4 may include a first photodiode PD1 and a second photodiode PD2 isolated from each other in a second direction. A pixel circuit may be disposed below the first photodiode PD1 and the second photodiode PD2. As an example, the pixel circuit may include a plurality of devices 160, wiring patterns 170 connected to the plurality of devices 160, and an insulating layer 180 for covering the plurality of devices 160 and the wiring patterns 170 and may be disposed on the second surface 112 of the substrate 110.

The pixel circuit may include a floating diffusion region 150. As an example, each of the plurality of pixels PX1, PX2, PX3, and PX4 may include the floating diffusion region 150 disposed below at least one of the first photodiode PD1 and the second photodiode PD2. As an example, the floating diffusion regions 150 may be electrically connected to each other by at least one of the wiring patterns 170, and the position and the area of each of the floating diffusion regions 150 may be varied in example embodiments.

As an example, the plurality of devices 160 adjacent to the floating diffusion region 150 may be configured as a first transfer transistor and a second transfer transistor. A gate of each of the first and second transfer transistors may have a vertical structure in which at least a partial region thereof is buried in the substrate 110.

In example embodiments, each of the plurality of pixels PX1, PX2, PX3, and PX4 may include color filters 121, 122, and 123, a light transmitting layer 130, and microlenses 141, 142, and 143, disposed on the first surface 111 of the substrate 110. For example, each of the plurality of pixels PX1, PX2, PX3, and PX4 may include one of microlenses 141, 142, and 143 disposed above the first photodiode PD1 and the second photodiode PD2. Accordingly, light passing through one of the microlenses 141, 142, and 143 may be incident to both the first photodiode PD1 and the second photodiode PD2.

In the image sensors 100a and 100b in example embodiments, the first device isolation film DTI1 and the second device isolation film DTI2 may be spaced apart from each other. Accordingly, the first device isolation film DTI1 and the second device isolation film DTI2 may be formed separately. For example, the second device isolation film DTI2 may extend in the first direction from the first surface 111 of the substrate 110 toward the second surface 112 and may be isolated from the second surface 112. As an example, the first device isolation film DTI1 may extend from the second surface 112 of the substrate toward the first surface 111 as in the image sensor 100a illustrated in FIGS. 4, 5, 6, and 7. In another example, the first device isolation film DTI1 may extend from the first surface 111 toward the second surface 112 as in the image sensor 100b illustrated in FIGS. 8, 9, 10, and 11.

Structures of the image sensors 100a and 100b may be varied according to a method of forming the first device isolation film DTI1. For example, when the first device isolation film DTI1 extends from the second surface 112 toward the first surface 111 differently from the second device isolation film DTI2, the first device isolation film DTI1 may be connected to both the second surface 112 and the first surface 111. In other words, each of the pixels PX1, PX2, PX3, and PX4 in the substrate 110 may be completely isolated from each other by the first device isolation film DTI1. Since the first device isolation film DTI1 and the second device isolation film DTI2 have different lengths, and it is difficult to accurately predict the formed position, the first device isolation film DTI1 and the second device isolation film DTI2 may not be connected to each other. However, an example embodiment thereof is not limited thereto.

When the first device isolation film DTI1 extends from the first surface 111 toward the second surface 112 similarly to the second device isolation film DTI2, the length of the first device isolation film DTI1 may be shorter than the length of the first device isolation film DTI1 illustrated in FIGS. 4, 5, 6, and 7. In other words, the first device isolation film DTI1 may be connected only to the first surface 111 and may not be connected to the second surface 112. However, an example embodiment thereof is not limited thereto, and the first device isolation film DTI1 may be connected to both the first surface 111 and the second surface 112.

Referring to FIGS. 4 and 5, in the image sensor 100a in an example embodiment, the first device isolation film DTI1 and the second device isolation film DTI2 may be spaced apart from each other. Accordingly, at least one of the cross-sectional surfaces of the image sensor 100a in the second direction (e.g., the x direction) may have a shape as in the example in FIG. 4, which does not include the second device isolation film DTI2. Referring to the example in FIG. 5 which includes the second device isolation film DTI2, the second device isolation film DTI2 may overlap at least a portion of at least one of the first photodiode PD1 and the second photodiode PD2.

Similarly, referring to FIGS. 8 and 9, a shape similar to that of the image sensor 100a illustrated in FIGS. 4 and 5 may appear in the image sensor 100b in an example embodiment. However, as described above, the first device isolation film DTI1 included in the image sensor 100b illustrated in FIGS. 8 and 9 may extend from the first surface 111 toward the second surface 112. For example, the length of the first device isolation film DTI1 included in the image sensor 100a in the first direction may be defined as da1. The length of the first device isolation film DTI1 included in the image sensor 100b may be defined as db1 shorter than da1. The lengths of the second device isolation films DTI2 included in the image sensors 100a and 100b in the first direction in the example embodiments may be da2 and db2, respectively. For example, da2 and db2 may have similar values. However, an example embodiment thereof is not limited thereto, and the length of the second device isolation film DTI2 may be determined differently, such that da2 and db2 may have different values.

Figure 7:
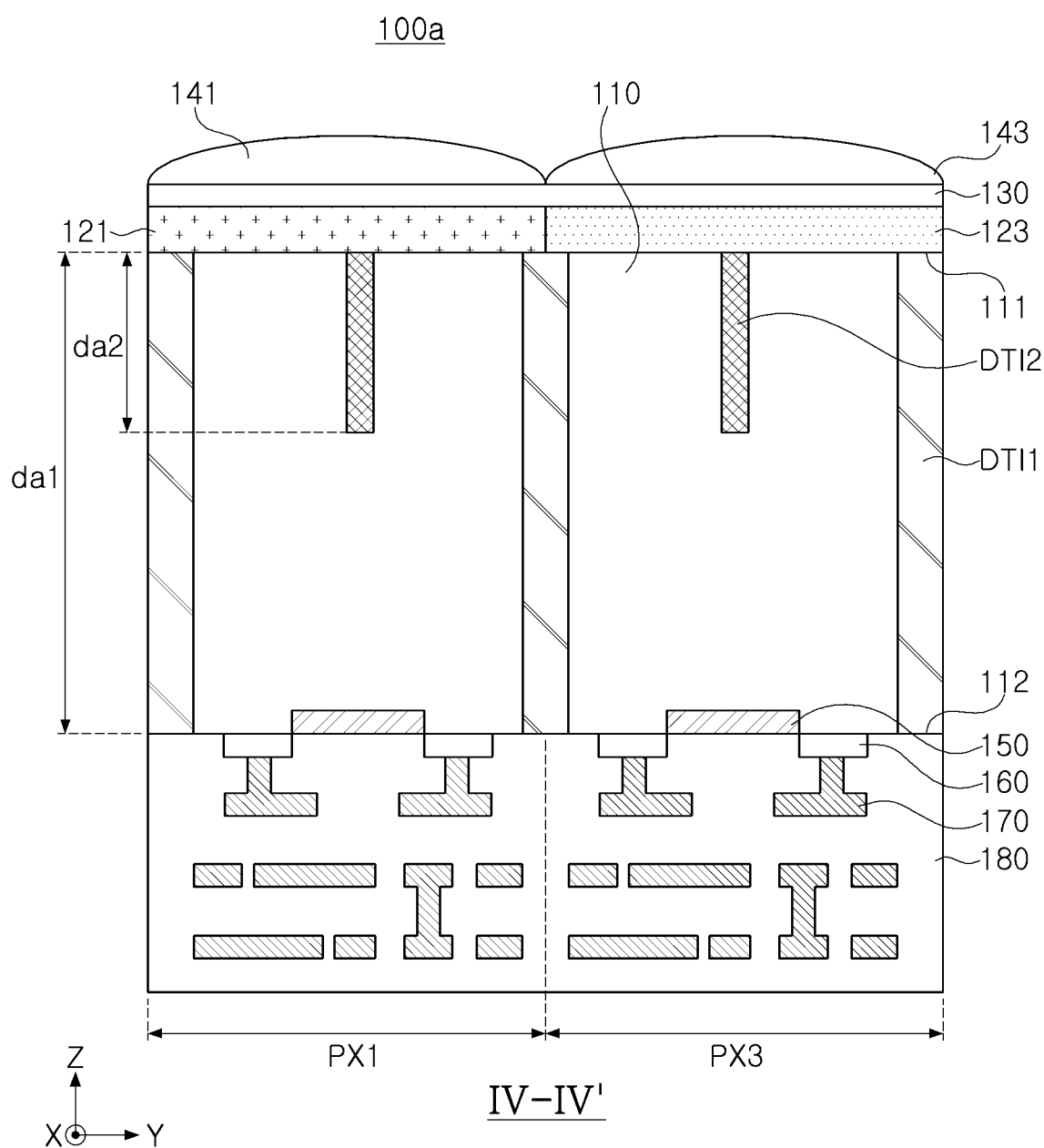

Referring to FIGS. 6 and 7, a cross-sectional surface of the image sensor 100a in an example embodiment may include a first device isolation film DTI1 having the same shape as that of the first device isolation film DTI1 included in the cross-sectional surface of the image sensor 100a illustrated in FIGS. 4 and 5. As an example, the cross-sectional surface of the image sensor 100a illustrated in FIG. 6 in the cutting direction may only include the first photodiode PD1. Also, the cross-sectional surface of the image sensor 100a illustrated in FIG. 7 may include a second device isolation film DTI2 without the first photodiode PD1 and the second photodiode PD2. However, an example embodiment thereof is not limited thereto, and the shape of the cross-sectional surface may be varied depending on the shape of the second device isolation film DTI2.

Figure 11:
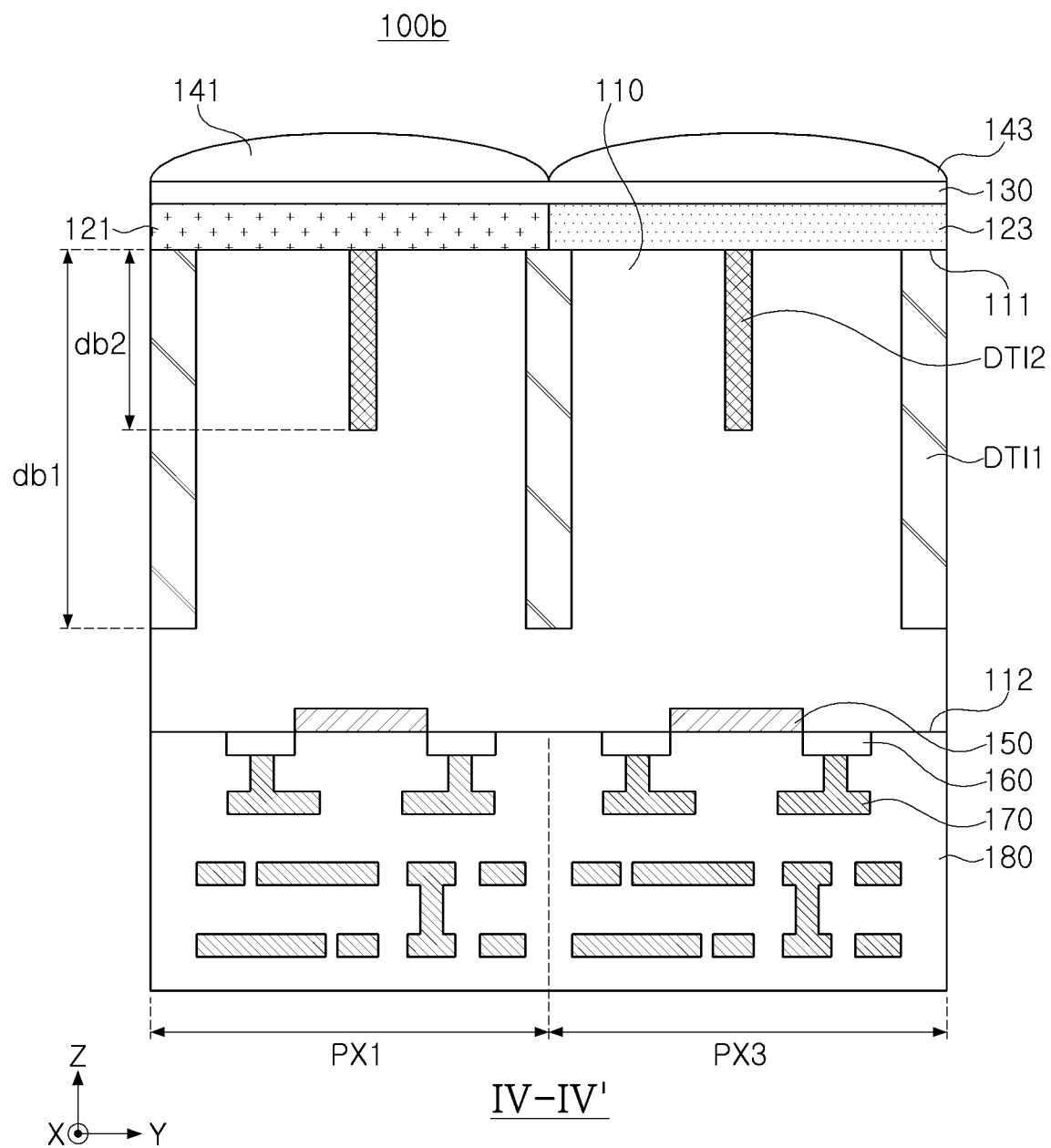

Referring to FIGS. 10 and 11, a cross-sectional surface of the image sensor 100b in an example embodiment may be similar to the cross-sectional surface of the image sensor 100a illustrated in FIGS. 6 and 7 other than the first device isolation film DTI1 as described above. For example, the length of the first device isolation film DTI1 included in the cross-sectional surface of the image sensor 100b in the first direction may be defined as db1, and the length of the first device isolation film DTI1 included in the cross-sectional surface of the image sensor 100a may be defined as da1, which is longer than db1.

In the image sensor 100a in an example embodiment, a depth corresponding to the length of the first device isolation film DTI1 in the first direction may not be adjusted, whereas in the image sensor 100b, the length of the first device isolation film DTI1 in the first direction may be adjusted. The image sensors 100a and 100b in the example embodiments may maintain or improve autofocusing performance in all directions without any particular issues. However, since autofocusing sensitivity decreases as a pixel size decreases, when the image sensors 100a and 100b illustrated in FIGS. 4, 5, 6, 7, 8, 9, 10, and 11 are used, there may be an issue in maintaining or improving the autofocusing performance in all directions. For example, by increasing the length in which the second device isolation film DTI2 extends in the first direction, autofocusing sensitivity of the image sensors 100a and 100b may improve, but accordingly, crosstalk by incident light may increase, and a visibility issue may occur. To address the above issues, at least one of the plurality of pixels PX1, PX2, PX3, and PX4 may further include a third device isolation film connected to the first device isolation film DTI1 therein.

Figure 12:
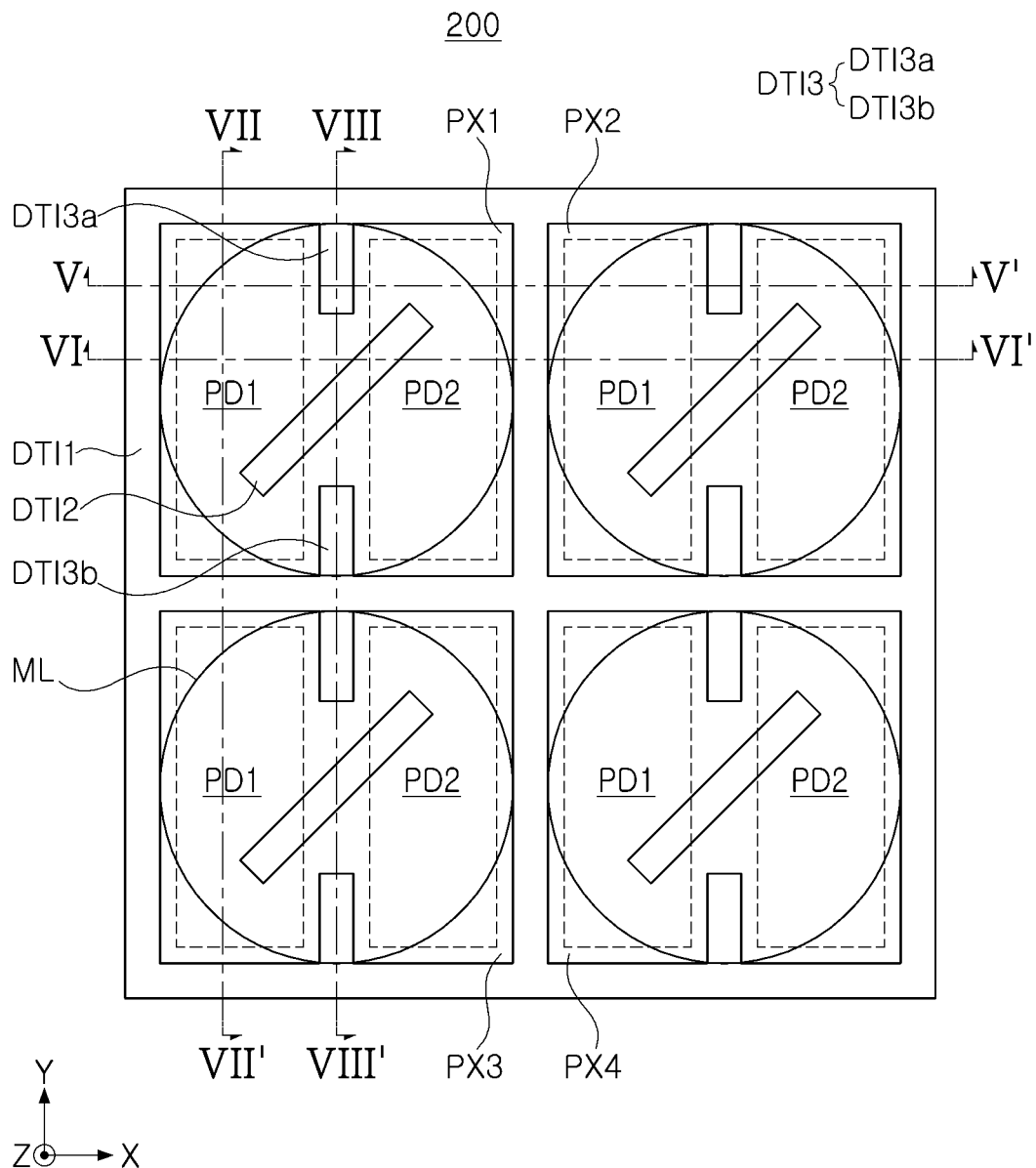
FIG. 12 is a diagram illustrating an image sensor, viewed from above, according to an example embodiment of the present disclosure.

FIG. 12 is a diagram illustrating an image sensor, viewed from above, according to an example embodiment.

Referring to FIG. 12, an image sensor 200 in an example embodiment may include first and second photodiodes PD1 and PD2, a first device isolation film DTI1 disposed between a plurality of pixels PX1, PX2, PX3, and PX4, a second device isolation film DTI2 disposed in each of the plurality of pixels PX1, PX2, PX3, and PX4, and a microlens ML. The image sensor 200 may include a pair of third device isolation films DTI3a and DTI3b (DTI3) extending from the first device isolation film DTI1 into each of the plurality of pixels PX1, PX2, PX3, and PX4 in a third direction (e.g., y direction) and opposing each other. For example, the second device isolation film DTI2 and the pair of third device isolation films DTI3 may be configured as pixel internal isolation films disposed in at least one of the plurality of pixels PX1, PX2, PX3, and PX4. For example, the other elements may be the same as or similar to those of the image sensor 100 in the example embodiment illustrated in FIG. 3.

As described above, when the length of the second device isolation film DTI2 in the first direction (e.g., z direction) is increased to increase autofocusing sensitivity, crosstalk may increase. Accordingly, in the image sensor 200 in an example embodiment, crosstalk may be reduced by decreasing the length of the second device isolation film DTI2 portion disposed in a central portion of a pixel, in the first direction. Also, in the image sensor 200, by increasing the length of the third device isolation film DTI3 portion disposed in an outer portion of a pixel in the first direction, autofocusing sensitivity may increase. In other words, the length of the second device isolation film DTI2 in the first direction may be shorter than the length of the pair of third device isolation films DTI3.

FIGS. 13, 14, 15, 16, 17, 18, 19, and 20 are cross-sectional diagrams illustrating an image sensor according to an example embodiment.

Figure 13:
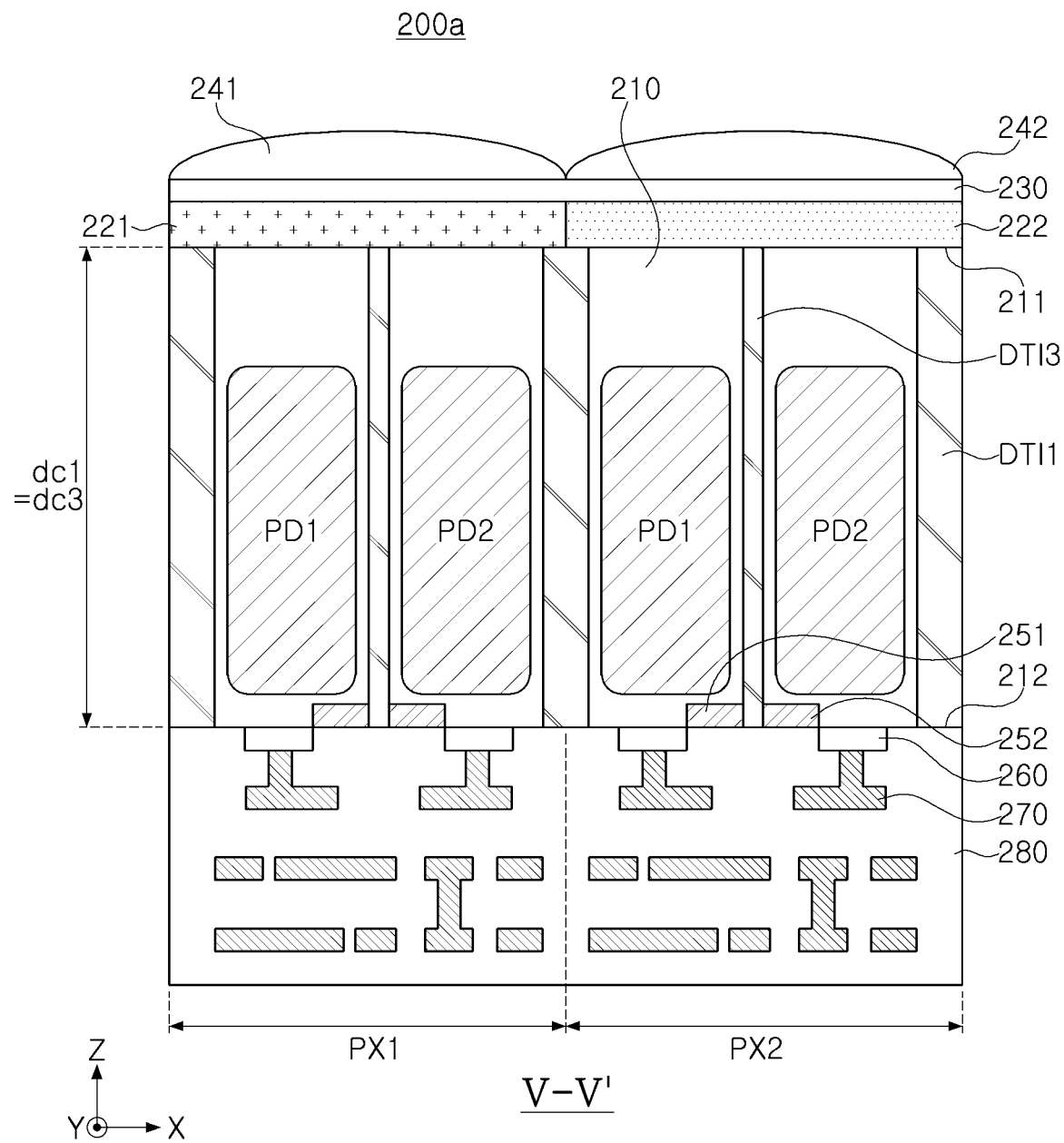
FIGS. 13, 14, 15, 16, 17, 18, 19, and 20 are cross-sectional diagrams illustrating an image sensor according to an example embodiment of the present disclosure.
Figure 14:
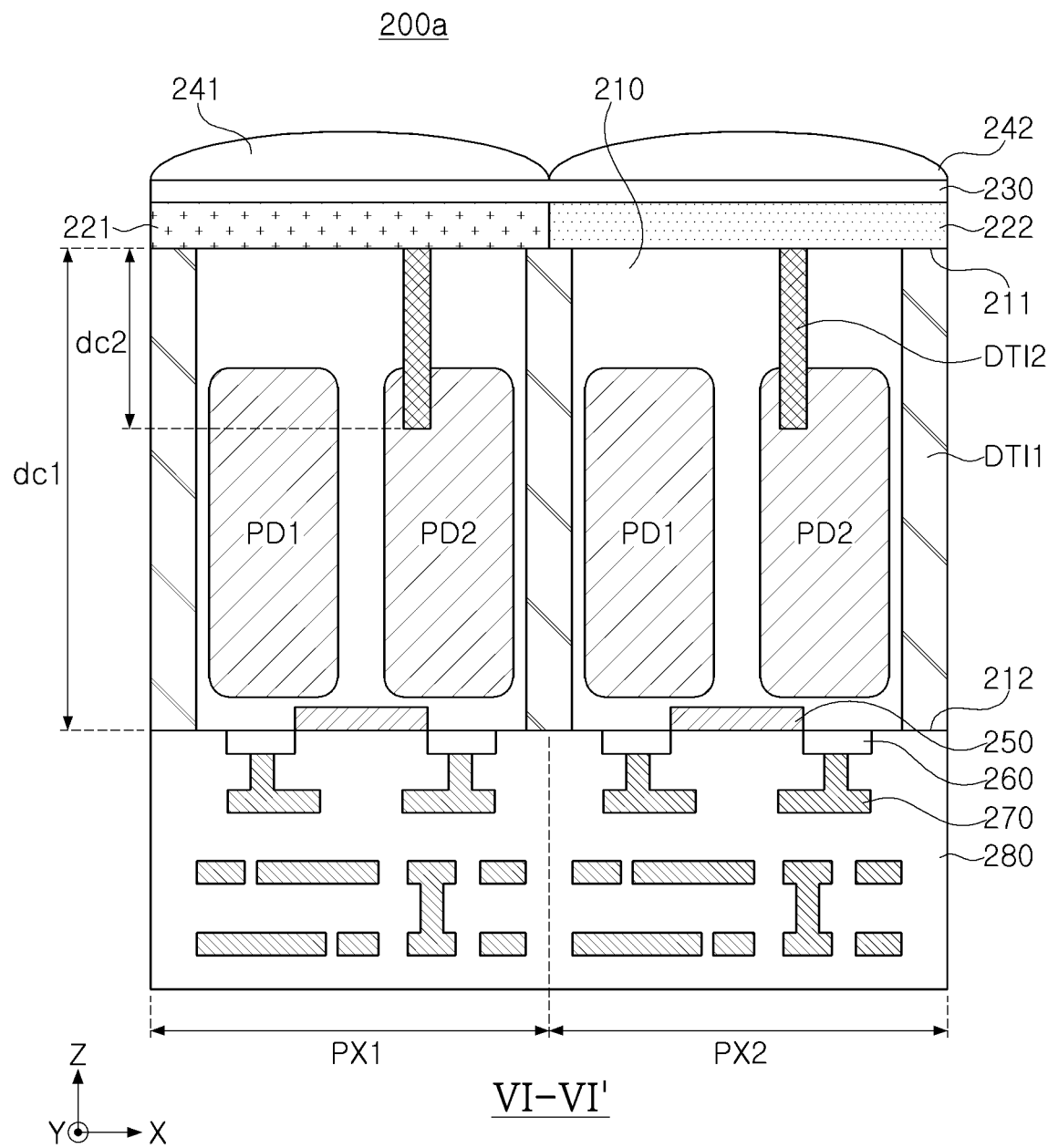
Figure 15:
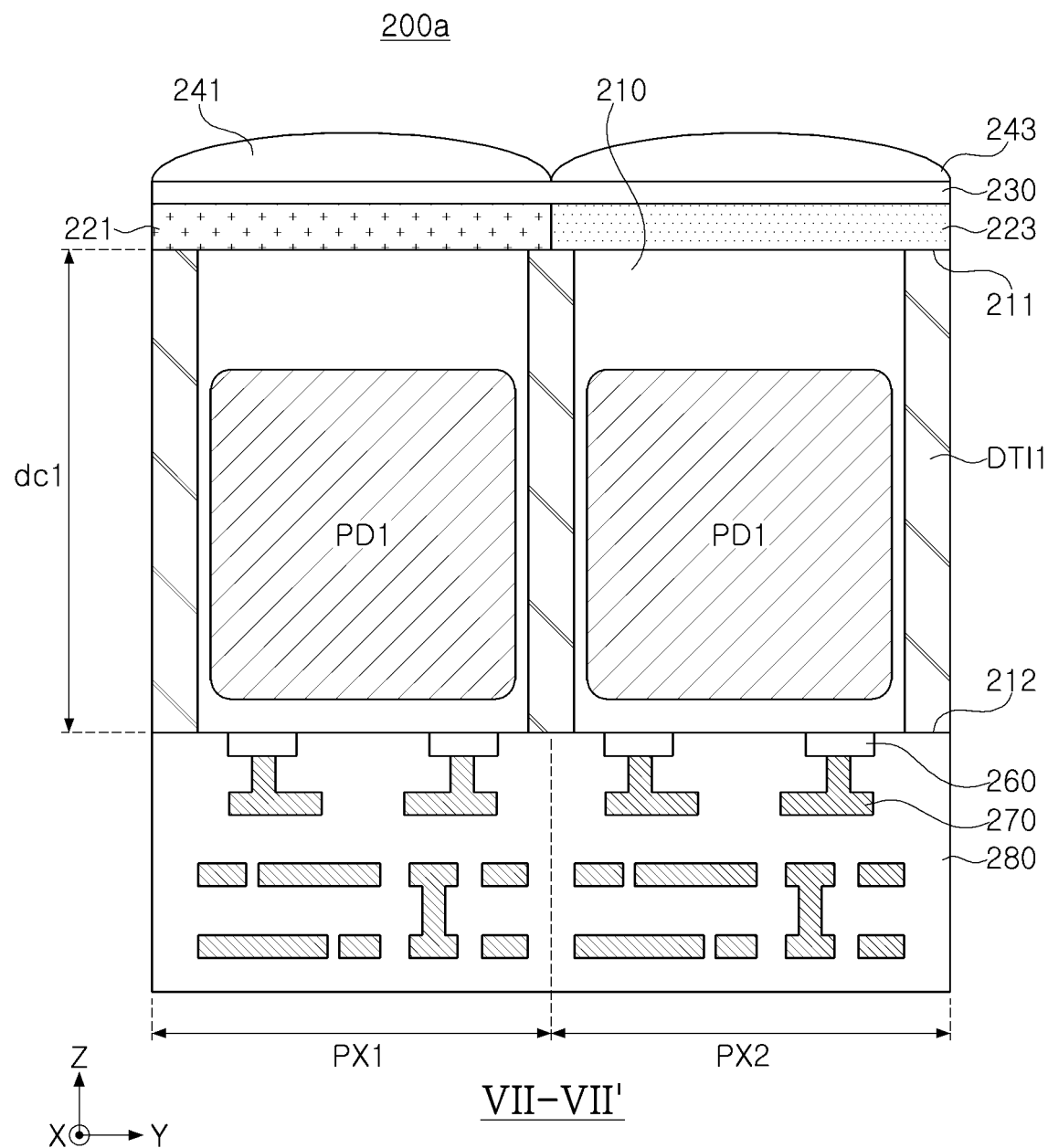
Figure 16:
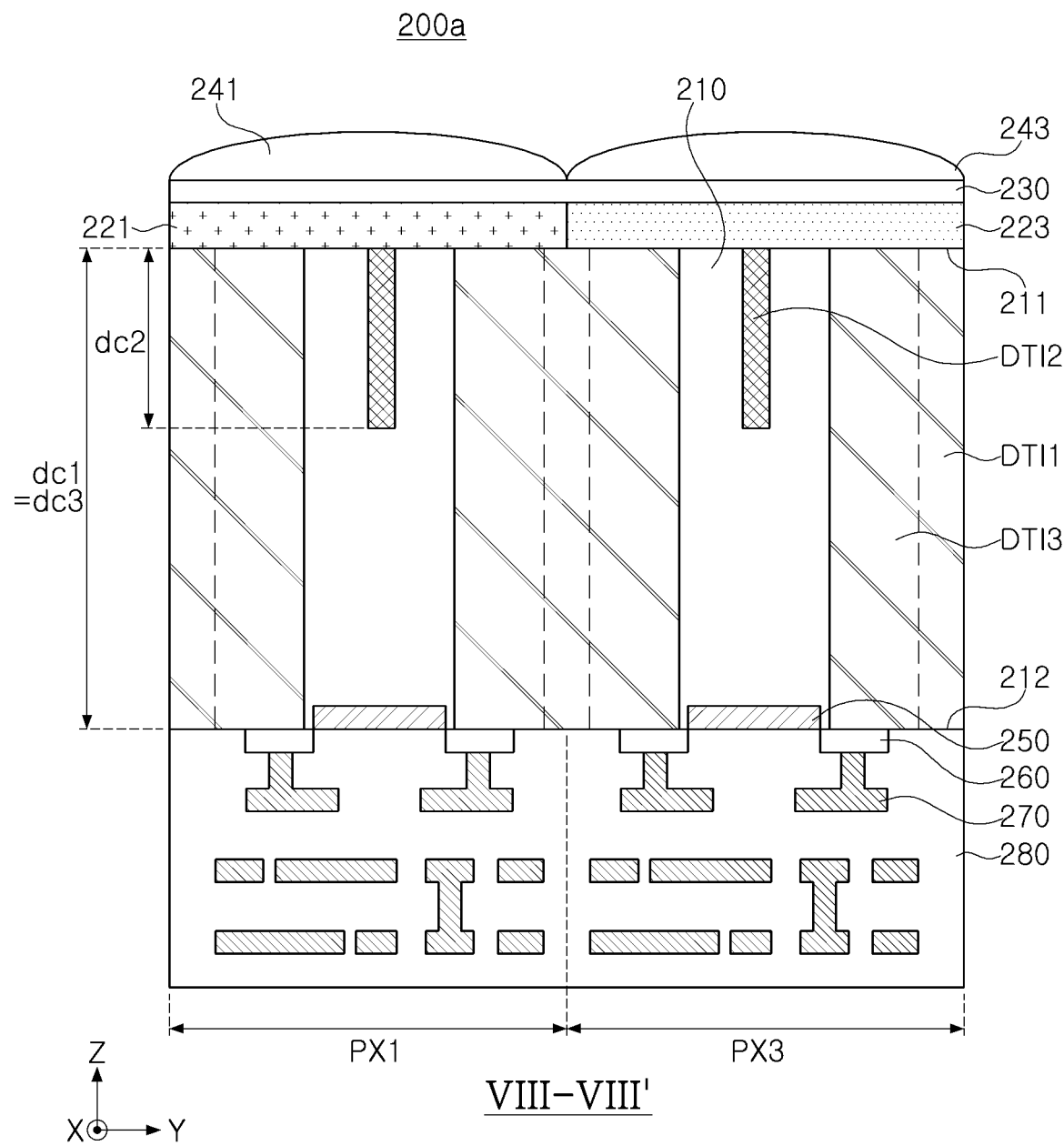
Figure 17:
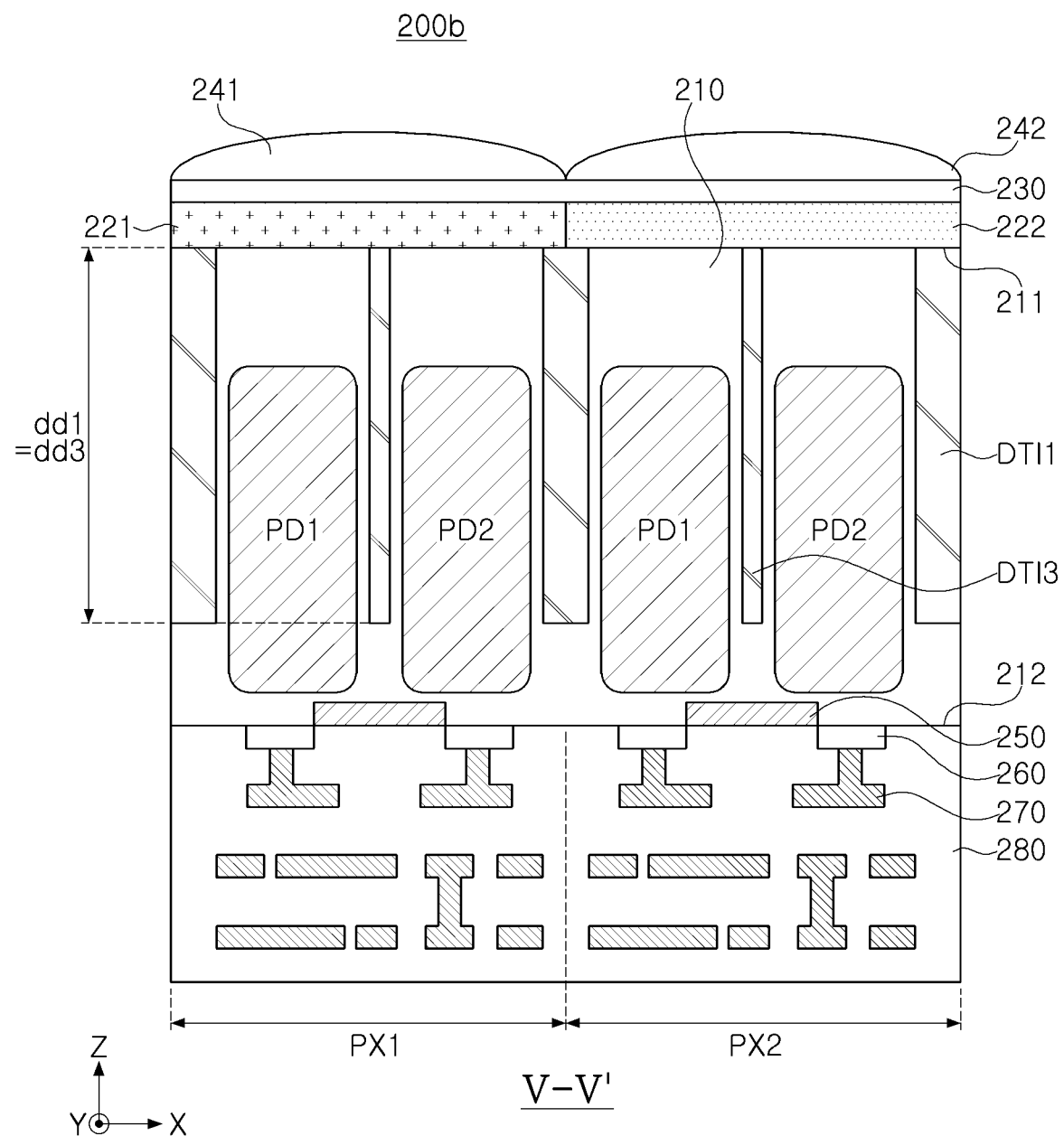
Figure 18:
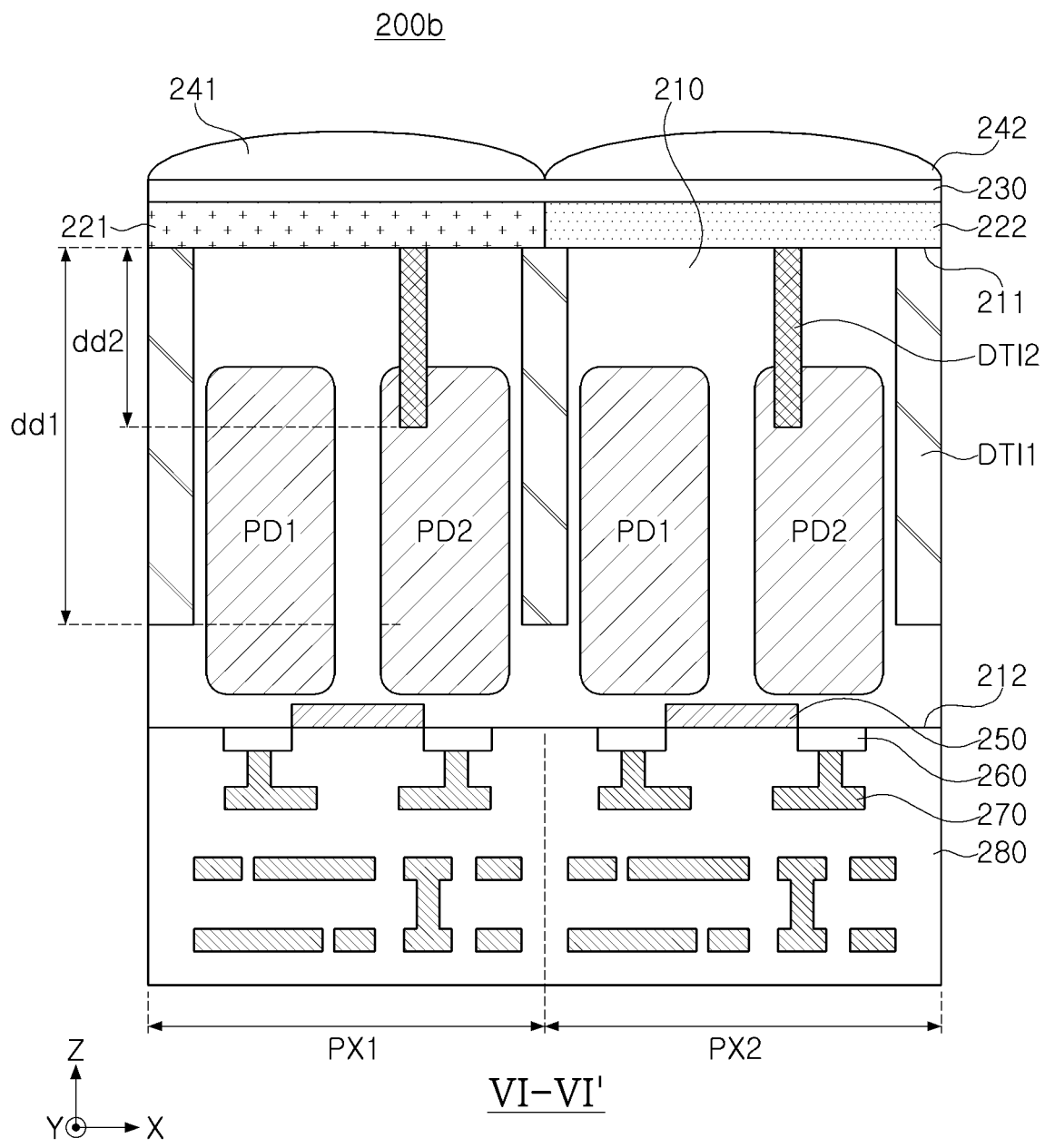
Figure 19:
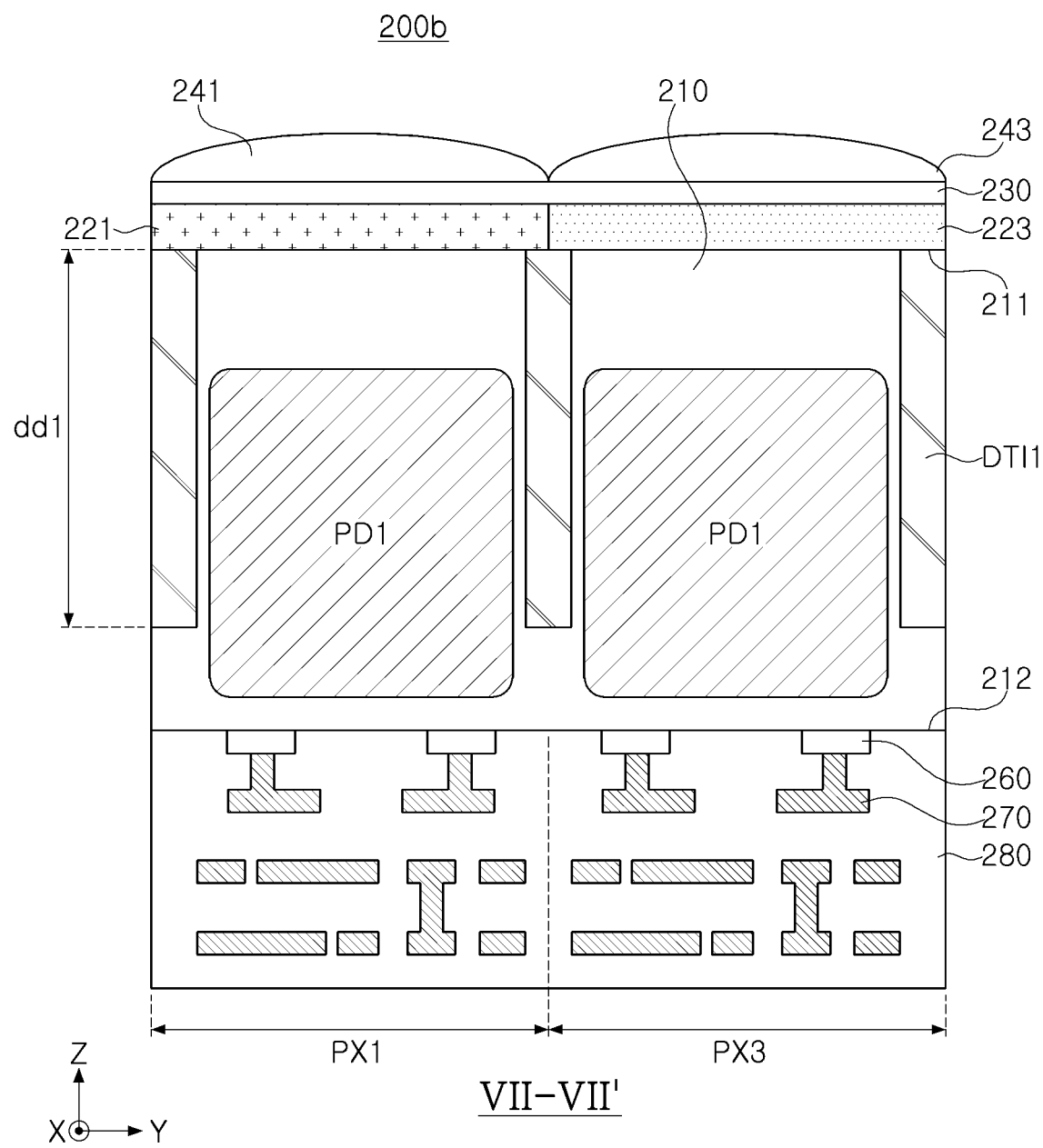
Figure 20:
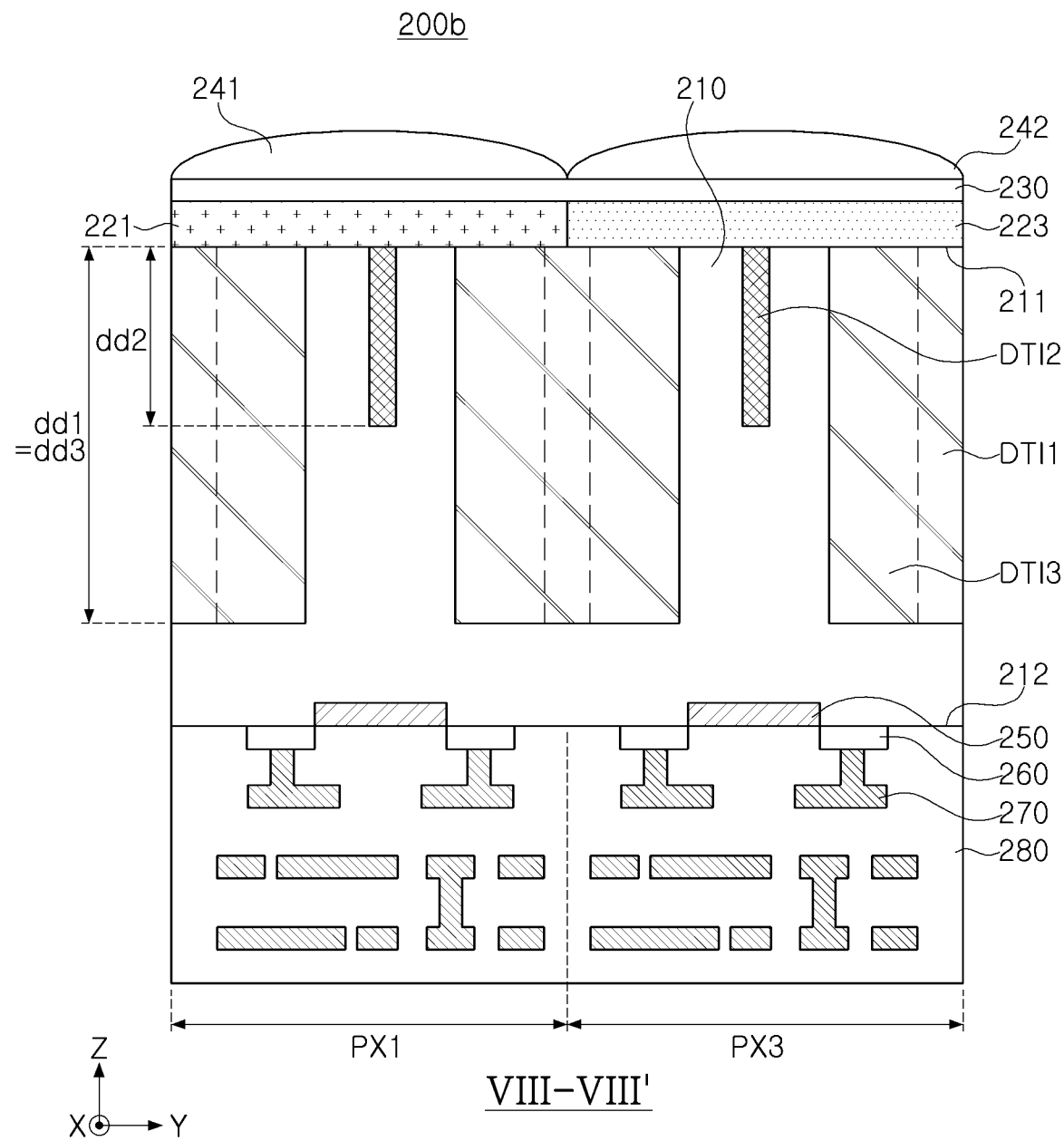

FIGS. 13, 14, 15, 16, 17, 18, 19, and 20 are cross-sectional diagrams illustrating an image sensor 200 taken along one of lines V-V' to VIII-VIII'. For example, FIGS. 13 and 17 are cross-sectional diagrams taken along line V-V' in FIG. 12, and FIGS. 14 and 18 are cross-sectional diagrams taken along line VI-VI' in FIG. 12. FIGS. 15 and 19 are cross-sectional diagrams taken along line VII-VII' in FIG. 12, and FIGS. 16 and 20 are cross-sectional diagrams taken along line VIII-VIII' in FIG. 12.

Each of an image sensor 200a illustrated in FIGS. 13, 14, 15, and 16, and an image sensor 200b illustrated in FIGS. 17, 18, 19, and 20 may include a first device isolation films DTI1 extending in different manners, similarly to the image sensors 100a and 100b illustrated in FIGS. 4, 5, 6, 7, 8, 9, 10, 11, 12, and 13. Accordingly, the first device isolation film DTI1 included in each of the image sensor 200a and the image sensor 200b may have different structures. The elements other than the first device isolation film DTI1 included in the image sensors 200a and 200b in the example embodiments may be the same. However, the image sensors 200a and 200b illustrated in FIGS. 13, 14, 15, 16, 17, 18, 19, and 20 are merely example embodiments and an example embodiment thereof is not limited thereto. Some elements may be added or may not be provided if desired.

Referring to FIGS. 13, 14, 15, 16, 17, 18, 19, and 20, the image sensors 200a and 200b in the example embodiments may include a substrate 210, a first device isolation film DTI1, a second device isolation film DTI2, first and second photodiodes PD1 and PD2, and a pixel circuit, which correspond to the elements in FIGS. 4, 5, 6, 7, 8, 9, 10, 11, 12, and 13.

For example, the image sensors 200a and 200b may include color filters 221, 222, and 223 having red, green, or blue colors, a light transmitting layer 230, and microlenses 241, 242, and 243, disposed on the first surface 211 of the substrate 210. Also, the pixel circuit may include a floating diffusion region 250, a plurality of devices 260, wiring patterns 270 connected to the plurality of devices 260, and an insulating layer 280 for covering the plurality of devices 260 and the wiring patterns 270, and may be disposed on the second surface 212 of the substrate 210.

The image sensors 200a and 200b in example embodiments may further include a third device isolation film DTI3, differently from the image sensors 100a and 100b described in the aforementioned example embodiments.

The image sensor 200a illustrated in FIGS. 13, 14, 15, and 16 may include a first device isolation film DTI1 extending from a second surface 212 of the substrate 210 toward a first surface 211, similarly to the image sensor 100a. The image sensor 200b illustrated in FIGS. 17, 18, 19, and 20 may include a first device isolation film DTI1 extending from a first surface 211 of the substrate 210 toward a second surface 212, similarly to the image sensor 100b. The structural difference between the image sensors 200a and 200b caused by characteristics of the first device isolation film DTI1 may be similar to the structural difference between the image sensors 100a and 100b described in the aforementioned example embodiments. However, the third device isolation film DTI3 may extend in the same direction as the direction in which the first device isolation film DTI1 extends. Accordingly, cross-sectional surfaces of the image sensors 200a and 200b illustrated in FIGS. 13, 14, 15, 16, 17, 18, 19, and 20 may have different shapes.

Referring to FIG. 13, the third device isolation film DTI3 may extend from the second surface 212 of the substrate 210 to the first surface 211, similarly to the first device isolation film DTI1. Accordingly, the floating diffusion regions 251 and 252 included in the image sensor 200a illustrated in FIG. 13 may be divided into two regions. The length dc1 of the first device isolation film DTI1 in the first direction may have the same value as that of the length dc3 of the third device isolation film DTI3.

Referring to FIG. 17, the third device isolation film DTI3 may extend from the first surface 211 of the substrate 210 toward the second surface 212, similarly to the first device isolation film DTI1. Accordingly, the length dd1 of the first device isolation film DTI1 in the first direction may have the same value as that of the length dd3 of the third device isolation film DTI3, and the sizes dd1 and dd3 may be smaller than the sizes dc1 and dc3. However, an example embodiment thereof is not limited thereto, and dd1 and dd3 may have different values. Also, at least one of the sizes dd1 and dd3 may have the same value as those of the sizes dc1 and dc3.

Since the cross-sectional surface of the image sensor 200a illustrated in FIGS. 14 and 15 is irrespective of the third device isolation film DTI3, the cross-sectional surface of the image sensor 200a may be the same as the cross-sectional surface of the image sensor 100a illustrated in FIGS. 5 and 6. Similarly, since the cross-sectional surface of the image sensor 200b illustrated in FIGS. 18 and 19 is also irrespective of the third device isolation film DTI3, the cross-sectional surface of the image sensor 200b may be the same as the cross-sectional surface of the image sensor 100b illustrated in FIGS. 9 and 10.

Referring to FIG. 16, the cross-sectional surface of the image sensor 200a in an example embodiment may include a second device isolation film DTI2 and a third device isolation film DTI3 without a first photodiode PD1 and a second photodiode PD2. However, an example embodiment thereof is not limited thereto, and the shape of the cross-sectional surface may be varied depending on the shapes of the second device isolation film DTI2 and the third device isolation film DTI3. Since the second device isolation film DTI2 extends from the first surface 211 of the substrate 210, differently from the first and third device isolation films DTI1 and DTI3, the length dc2 of the second device isolation film DTI2 in the first direction may have a value lower than those of the lengths dc1 and dc3 of the first and third device isolation films DTI1 and DTI3.

One cross-sectional surface of the image sensor 200b illustrated in FIG. 20, corresponding to one cross-sectional surface of the image sensor 200a illustrated in FIG. 16 may be similar to the example illustrated in FIG. 16, except for the lengths of the first and third device isolation films DTI1 and DTI3. For example, since the first and third device isolation films DTI1 and DTI3 included in the image sensor 200b extend from the first surface 211 of the substrate 210, similarly to the second device isolation film DTI2, the lengths dd1, dd2, and dd3 of the first, second, and third device isolation films DTI1, DTI2, and DTI3 may have a value lower than those of dc1 and dc3. However, an example embodiment thereof is not limited thereto. The size relationship among dd1 to dd3 and dc2 may be varied in example embodiments.

FIGS. 21A to 25D are diagrams illustrating characteristics of a second device isolation film included in an image sensor according to an example embodiment.

Referring to FIGS. 21A to 25D, a second device isolation film DTI2 included in the image sensor in an example embodiment may be configured under various conditions.

Figure 21A:
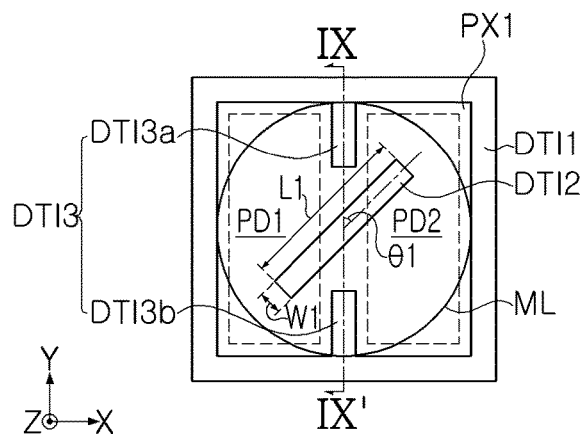
FIGS. 21A to 25D are diagrams illustrating characteristics of a second device isolation film included in an image sensor according to an example embodiment of the present disclosure.
Figure 21B:
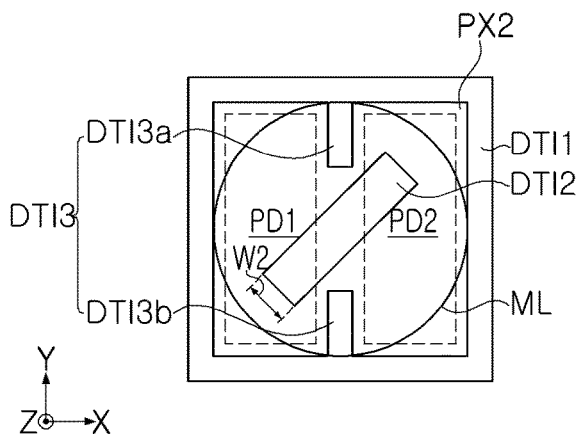
Figure 21C:
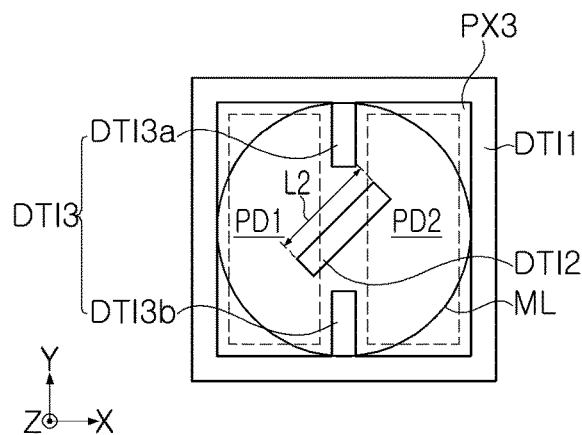
Figure 21D:
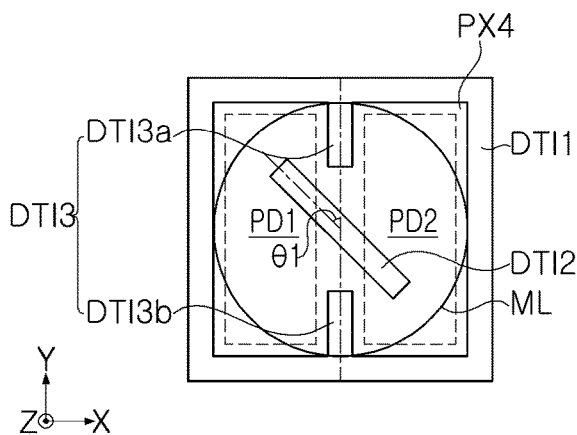

Referring to FIG. 21A, the second device isolation film DTI2 included in a first pixel PX1 may extend in a direction intersecting with the second direction and the third direction, and may have an angle of θ1 with respect to the second direction. Also, the second device isolation film DTI2 may have a length L1 and a width W1 on a plane.

The second device isolation film DTI2 included in the image sensor in an example embodiment may have a predetermined width and a predetermined length to increase autofocusing performance in a range in which the second device isolation film DTI2 is isolated from the first device isolation film DTI1. As an example, the second device isolation film DTI2 included in the second pixel PX2 illustrated in FIG. 21B may have a width W2 greater than W1, and the second device isolation film DTI2 included in the third pixel PX3 illustrated in FIG. 21C may have a length L2 shorter than L1. Also, the second device isolation film DTI2 included in the fourth pixel PX4 illustrated in FIG. 21D may extend in a direction intersecting with the second direction and the third direction, and may have an angle of −θ1 formed in a direction opposite to the direction of the second device isolation film DTI2 included in the first pixel PX1 illustrated in FIG. 21A with respect to the second direction. For example, the second device isolation film DTI2 included in the image sensor in the example embodiment may extend in a direction intersecting with the second direction and the third direction. For example, the second separator DTI2 may have an angle between 0° and 90° with respect to the second direction.

Figure 22:
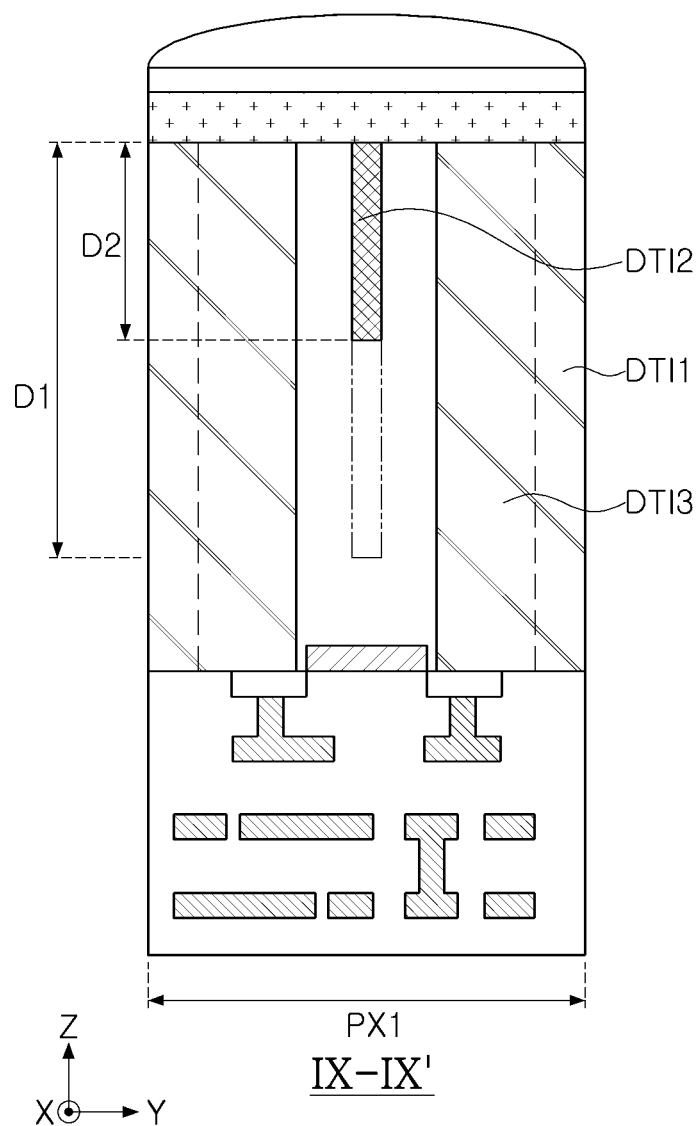

FIG. 22 may be a cross-sectional diagram illustrating the first pixel PX1 illustrated in FIG. 21A taken along line IX-IX'. For example, the second device isolation film DTI2 may have a predetermined depth in the first direction to increase autofocusing performance in the substrate. For example, the second device isolation film DTI2 included in the first pixel PX1 may extend by a depth of D2, but an example embodiment thereof is not limited thereto. The second device isolation film DTI2 may extend by an arbitrary depth D1.

Figure 23A:
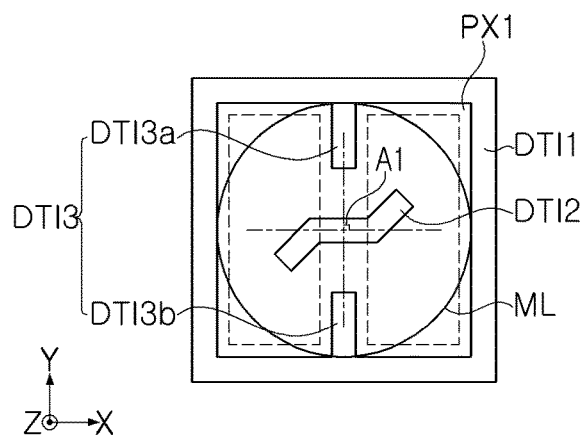

Referring to FIG. 23A, the second device isolation film DTI2 included in the first pixel PX1 may include a first region configured to overlap a portion of at least one of a first photodiode and a second photodiode and a second region disposed between the first photodiode and the second photodiode. The first region and the second region may extend to intersect with each other. For example, the first region and the second region may have different angles with respect to the second direction. For example, the first region of the second device isolation film DTI2 included in the first to third pixels PX1-PX3 illustrated in FIGS. 23A, 23B, and 23C may extend in a direction intersecting with the second and third directions, and may have an angle of θ1 with respect to the second direction. The second region of the second device isolation film DTI2 included in the first pixel PX1 illustrated in FIG. 23A may have an angle A1 perpendicular to the second direction. Also, the second region of the second device isolation film DTI2 included in the second pixel PX2 illustrated in FIG. 23B may have an angle A2, an acute angle greater than θ1, and the second region of the second device isolation film DTI2 included in the pixel PX3 illustrated in FIG. 23C may have an angle A3, an obtuse angle greater than θ1. However, an example embodiment thereof is not limited thereto, and the shapes of the first region and the second region may be configured differently if desired.

Figure 23B:
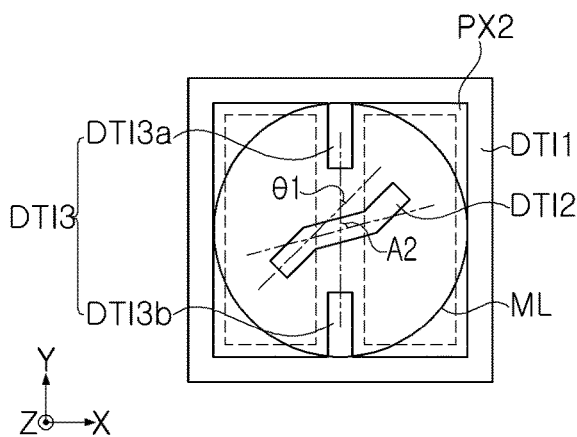
Figure 23C:
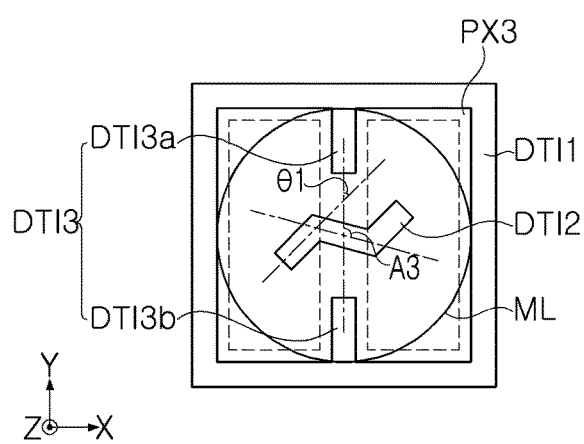
Figure 23D:
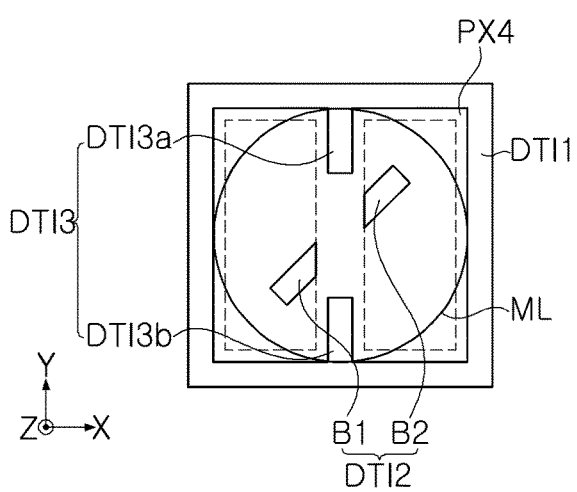

The first region included in the fourth pixel PX4 illustrated in FIG. 23D may include a first overlap region B1 configured to overlap the first photodiode, and a second overlap region B2 configured to overlap the second photodiode. For example, the first overlap region B1 may be configured to be spaced apart from the second overlap region B2. However, an example embodiment thereof is not limited thereto, and the second device isolation film DTI2 may further include a second region which does not overlap the first photodiode and the second photodiode, and portions of the second regions may be isolated from each other.

Figure 24A:
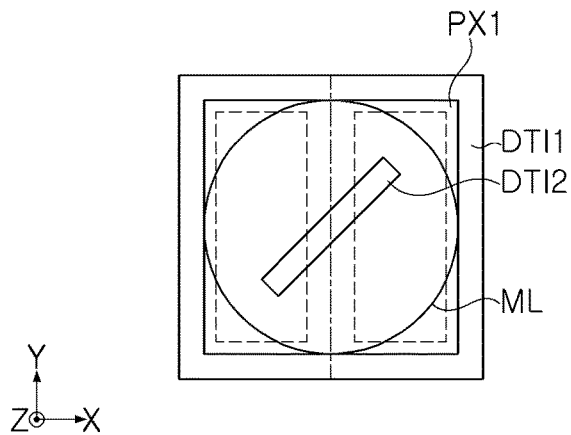
Figure 24B:
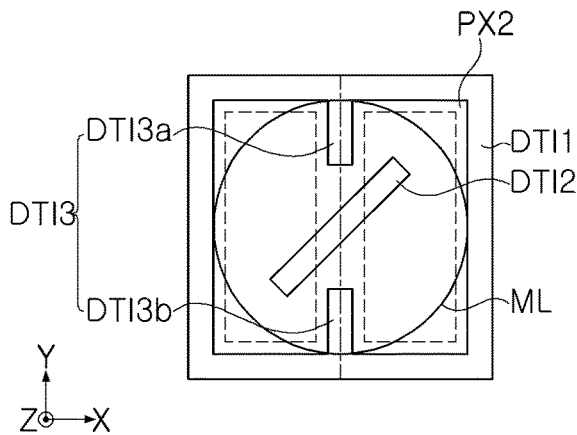
Figure 24C:
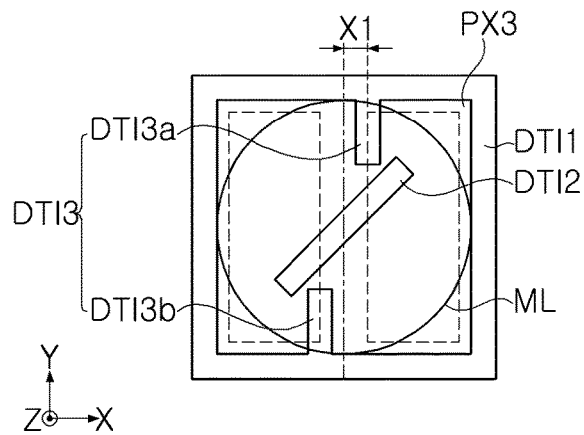
Figure 24D:
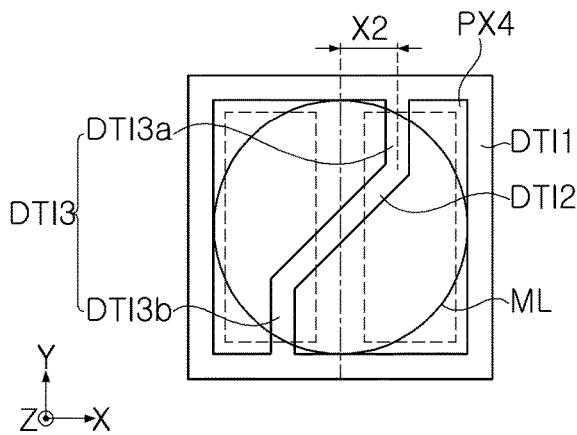

Referring to FIGS. 24B, 24C, and 24D, a pair of third device isolation films DTI2 may extend from different positions of the first device isolation film DTI1 in the second direction. Accordingly, the pair of third device isolation films may overlap at least one of the first photodiode and the second photodiode in the first direction.

As an example, the first pixel PX1 illustrated in FIG. 23A may be similar to the plurality of pixels PX1, PX2, PX3, and PX4 illustrated in FIG. 3, and the second pixel PX2 illustrated in FIG. 23B may be similar to the plurality of pixels PX1, PX2, PX3, and PX4 illustrated in FIG. 12. For example, in FIG. 23B, the pair of third device isolation films DTI3, comprising DTI3a and DTI3b, may be disposed between the first photodiode and the second photodiode coinciding with a central line of the second pixel PX2.

The pair of third device isolation films DTI3, comprising DTI3a and DTI3b, included in the third pixel PX3 illustrated in FIG. 24C may be deviated from the central line of the third pixel PX3 by X1. Also, the pair of third device isolation films DTI3, comprising DTI3a and DTI3b, included in the fourth pixel PX4 illustrated in FIG. 24D may be deviated from the central line of the fourth pixel PX4 by X2 greater than X1. However, an example embodiment thereof is not limited thereto and the degree to which the pair of third device isolation films DTI3 deviates from the central line of the pixel may be adjusted to increase the autofocusing performance of the image sensor. For example, the autofocusing sensitivity of the vertical pattern and/or the horizontal pattern may be controlled according to the position of the third device isolation film DTI3. For example, the autofocusing sensitivity for the horizontal pattern may improve to dispose the third device isolation film DTI3 to be adjacent to the central line of the pixel and the more the third device isolation film DTI3 is spaced apart from the central line of the pixel, the more the autofocusing sensitivity for the vertical pattern may improve.

Figure 25A:
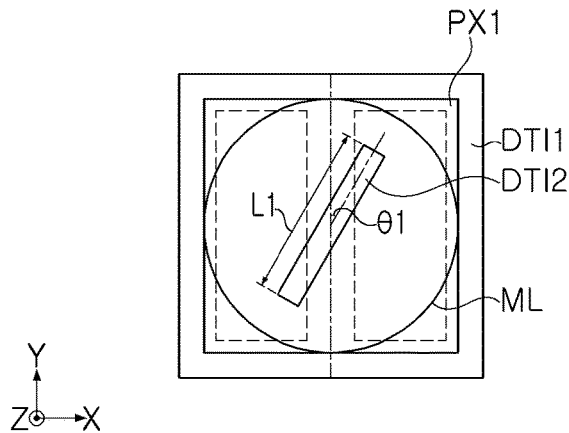
Figure 25B:
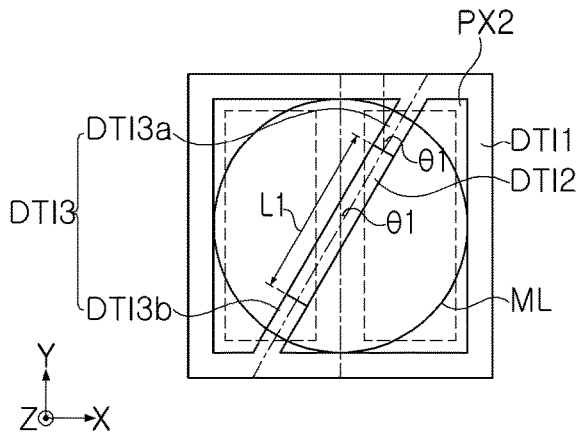
Figure 25C:
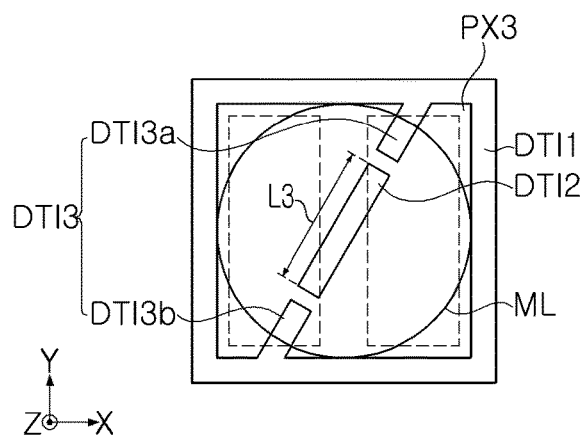
Figure 25D:
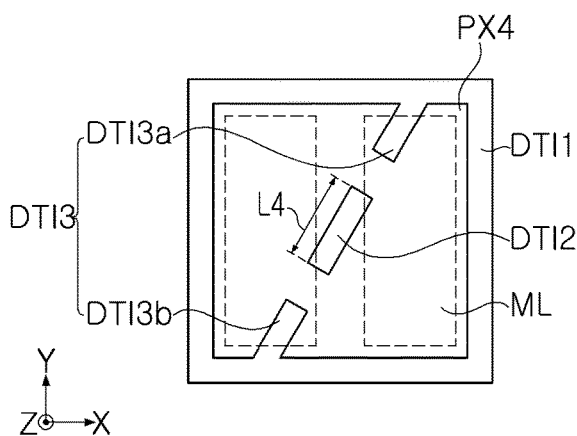

Referring to FIGS. 25B, 25C, and 25D, the pair of third device isolation films DTI3, comprising DTI3a and DTI3b, may extend in the same direction as the direction in which the second device isolation film DTI2 extends. For example, the second device isolation film DTI2 included in the first pixel PX1 illustrated in FIG. 25A may extend in a direction intersecting with the second direction and the third direction, and may have an angle of θ1 with respect to the second direction. The pair of third device isolation films DTI3 included in the second to fourth pixels PX2-PX4 illustrated in FIGS. 25B and 25D may have the same angle of θ1 as the second device isolation film DTI2 with respect to the second direction. For example, when the second device isolation film DTI2 and the pair of third device isolation films DTI3, comprising DTI3a and DTI3b, have the same angle with respect to the second direction, the autofocusing sensitivity for the vertical pattern may improve and diffusion between adjacent channels may be reduced.

A distance between the second device isolation film DTI2 and the pair of third device isolation films DTI3 may be adjusted by adjusting the length of the second device isolation film DTI2 while the angles of the second device isolation film DTI2 and the pair of third device isolation films DTI3 are the same, and further, the autofocusing sensitivity may be controlled. For example, the second device isolation film DTI2 included in the second pixel PX2 illustrated in FIG. 25B may have a length L1, and the second device isolation film DTI2 included in the third pixel PX3 illustrated in FIG. 25C may have a length L3 shorter than L1. Also, the second device isolation film DTI2 included in the fourth pixel PX4 illustrated in FIG. 25D may have a length L4 shorter than L3. For example, the more the distance between the second device isolation film DTI2 and the pair of third device isolation films DTI3 increases, the more the autofocusing sensitivity may decrease, and the more the distance between the second device isolation film DTI2 and the pair of third device isolation films DTI3 decreases, the autofocusing sensitivity may increase. However, an example embodiment thereof is not limited thereto, and the length of the second device isolation film DTI2 may be increased to be connected to the pair of third device isolation films DTI3.

As described in the aforementioned example embodiment with reference to FIGS. 21A to 25D, in the image sensor in an example embodiment, the shapes and the arrangements of the second device isolation film DTI2 and the pair of third device isolation films DTI3 may be varied if desired.

Figure 26:
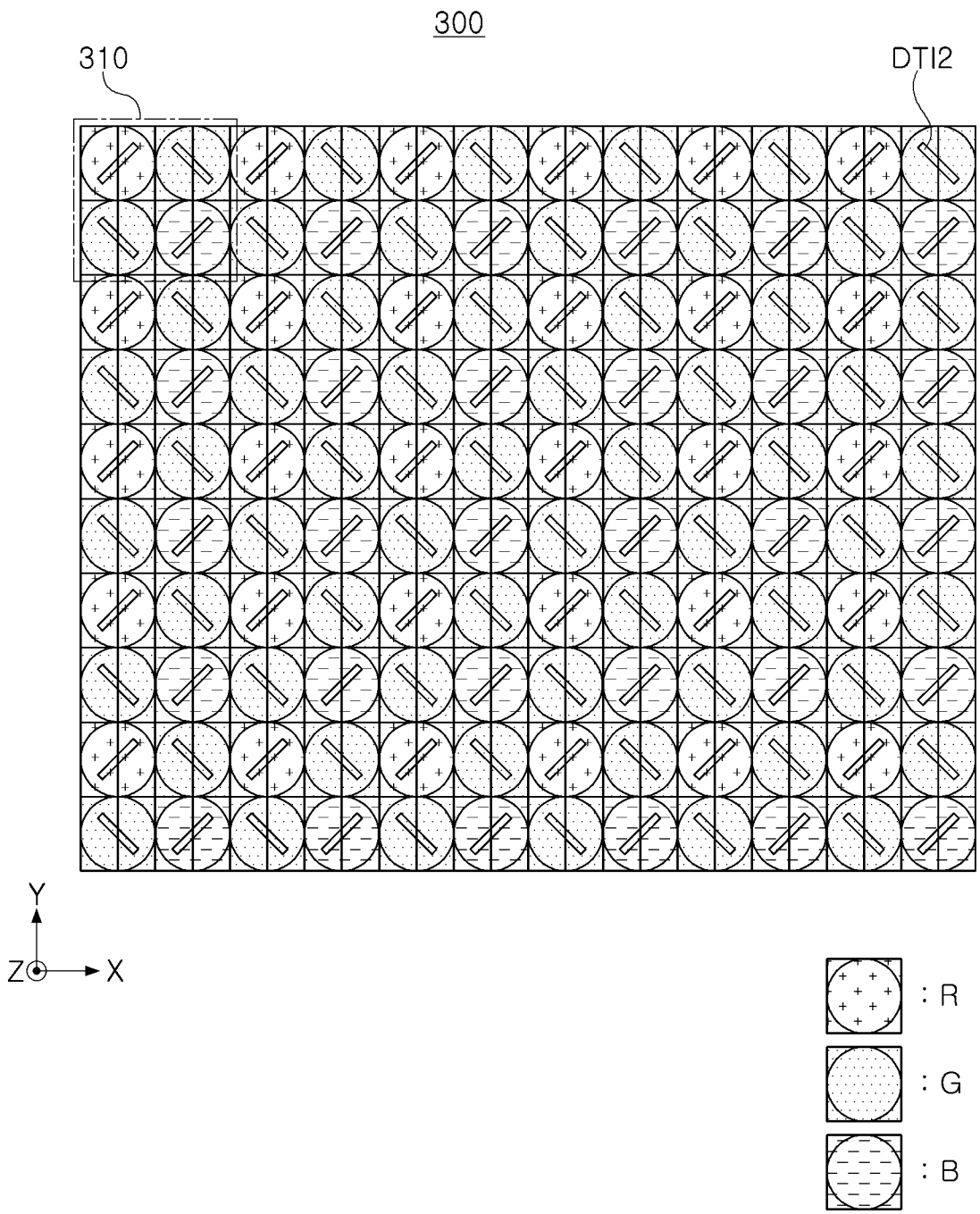
FIG. 26 is a diagram illustrating a pixel array of an image sensor according to an example embodiment of the present disclosure.

FIG. 26 is a diagram illustrating a pixel array of an image sensor according to an example embodiment. FIGS. 27A to 27H are diagrams illustrating arrangement of second device isolation films included in an image sensor according to an example embodiment.

Referring to FIG. 26, a pixel array 300 of an image sensor in an example embodiment may include a plurality of pixels PX. For example, the pixel array 300 may include general pixels and autofocusing pixels. A plurality of general pixels and a plurality of autofocusing pixels may be provided, and the number of general pixels and autofocusing pixels may be varied. For example, the pixel array 300 of the image sensor may only include autofocusing pixels. However, an example embodiment thereof is not limited thereto, and the number of normal pixels may be greater than the number of autofocusing pixels. Also, the position of the autofocusing pixel is also not limited to any particular position and may be varied.

The autofocusing pixel may include a first photodiode and a second photodiode. In the autofocusing pixel, the first photodiode and the second photodiode may be disposed in one direction (horizontal direction), and the first photodiode and the second photodiode may share a single microlens. In example embodiments, in a portion of the autofocusing pixels, the first photodiode and the second photodiode may be disposed in a direction different from the one direction.

The pixel array 300 of the image sensor in an example embodiment may include a color filter having an arrangement to generate an image having a Bayer pattern. For example, in the pixel array 300 of the image sensor, a 2×2 Bayer color filter array 310 in which red, green, green, and blue are disposed in order may be repeatedly disposed. However, an example embodiment thereof is not limited thereto, the color filter array repeatedly disposed may be varied.

In the pixel array 300 of the image sensor in an example embodiment, each of the plurality of pixels PX may include a second device isolation film DTI2. For example, at least one of the second device isolation films DTI2 may extend in a fourth direction intersecting with the second direction (e.g., the x direction) and the third direction (e.g., the y direction). For example, the fourth direction may be a diagonal direction having a predetermined angle from the second direction. For example, the predetermined angle may be a value between −90° and 90°. Each of the four pixels PX disposed below the Bayer color filter array 310 may include the second device isolation film DTI2. For example, each of the second device isolation films DTI2 included in the four pixels PX may extend in an arbitrary direction. For example, in at least a portion of the plurality of pixels PX, the second device isolation film DTI2 may extend in different directions.

Figure 27A:
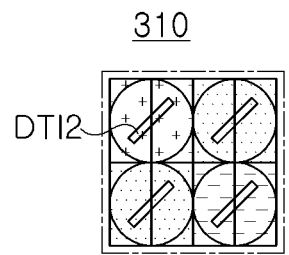
FIGS. 27A to 27H are diagrams illustrating arrangement of second device isolation films included in an image sensor according to an example embodiment of the present disclosure.

Referring to FIG. 27, the four pixels included in the Bayer color filter array 310 may include the second device isolation films DTI2 disposed in the same direction as in FIG. 27A. Alternatively, as in FIG. 27B, the four pixels may include the second device isolation films DTI2 disposed in a direction opposite to the direction in FIG. 27A.

Figure 27B:
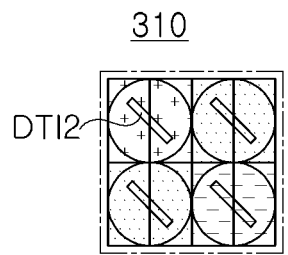
Figure 27C:
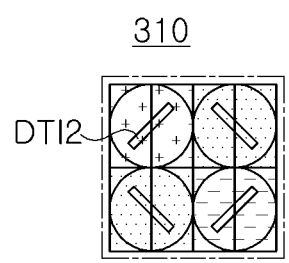
Figure 27D:
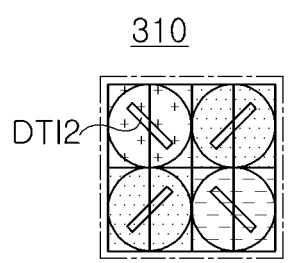

Referring to FIGS. 27C and 27D, each of the pixels may include the second device isolation film DTI2 extending in an arbitrary direction. Pixels disposed below the red color filter and pixels disposed below the blue color filter may include the second device isolation films DTI2 disposed in the same direction, and pixels disposed below the green color filter may include second device isolation films DTI2 disposed in the same direction.

Figure 27E:
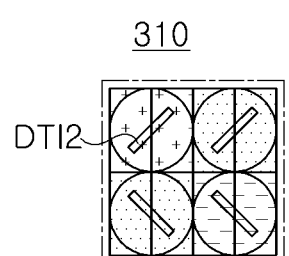
Figure 27F:
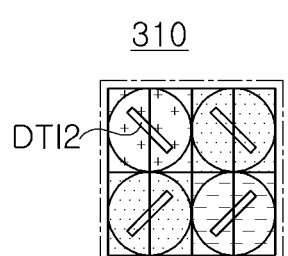

However, an example embodiment thereof is not limited thereto, and the pixels may include the second device isolation films DTI2 disposed in an arbitrary direction as in FIGS. 27E and 27F.

Figure 27G:
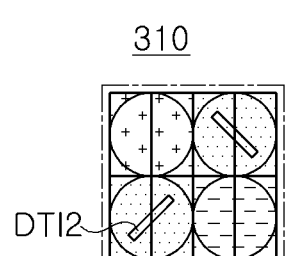
Figure 27H:
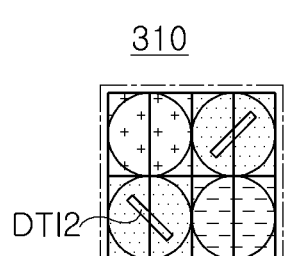

Also, the pixels disposed below the red and blue color filters may not include the second device isolation films DTI2 as in FIGS. 27G and 27H and only the pixels disposed below the green color filter may include the second device isolation films DTI2 disposed in opposite directions. Also, the pixels disposed below the Bayer color filter array 310 in an example embodiment may include the second device isolation films DTI2 disposed in various combinations.

When the Bayer color filter array 310 having pixels including the second device isolation films DTI2 disposed in the same direction as in FIGS. 27A and 27B is repeated, a visibility issue may occur in the image sensor. Differently from the above example, when the Bayer color filter array 310 having pixels including the second device isolation films DTI2 disposed disorderly is repeated in a disorganized manner, the arrangement may be disadvantageous in terms of process and also an algorithm. The arrangement of the second device isolation films DTI2 may need to be properly configured if desired.

Figure 28:
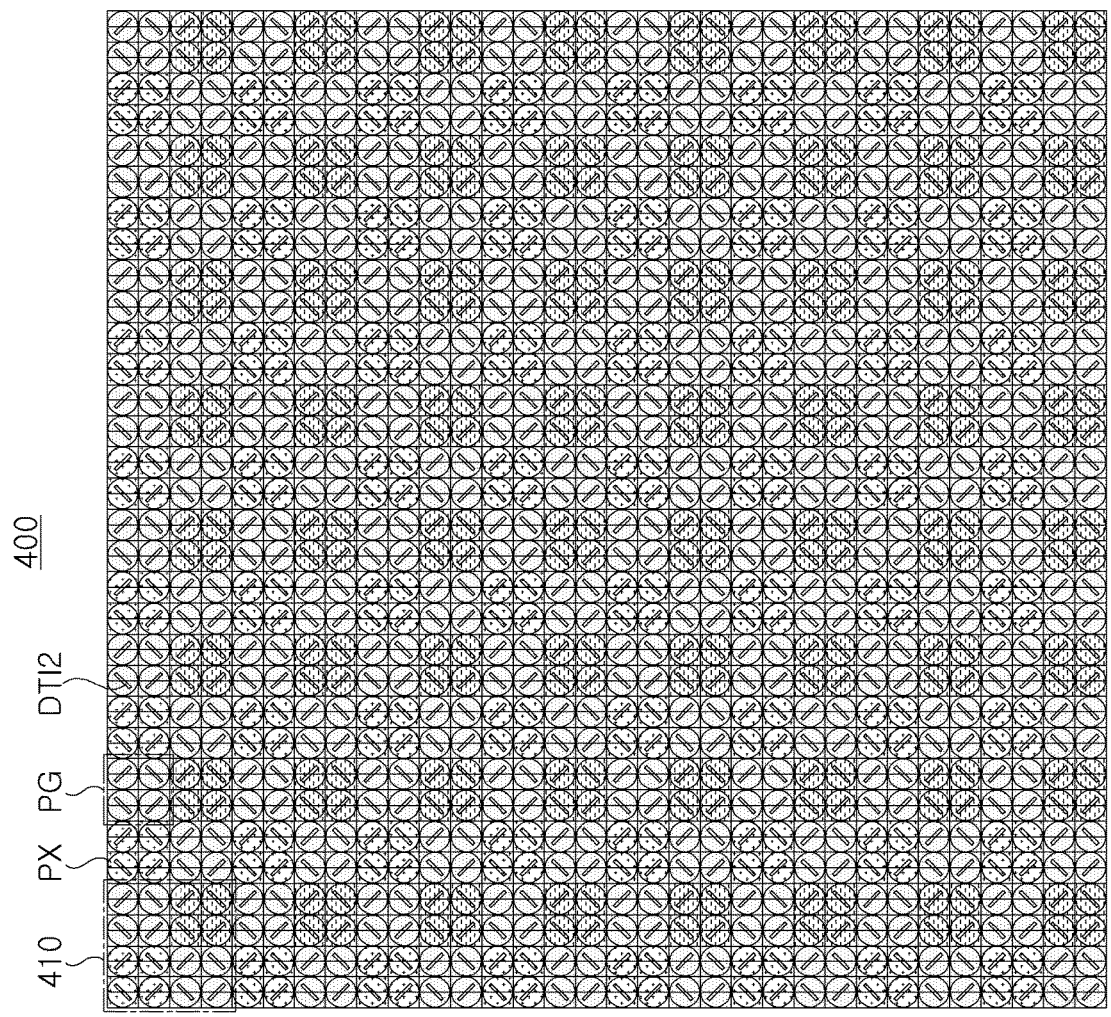
FIG. 28 is a diagram illustrating a pixel array of an image sensor according to an example embodiment of the present disclosure.
Figure 29A:
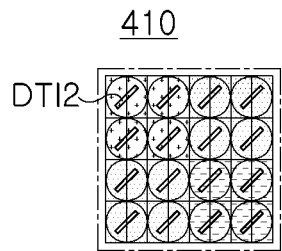
FIGS. 29A to 29P are diagrams illustrating arrangement of second device isolation films included in an image sensor according to an example embodiment of the present disclosure.
Figure 29B:
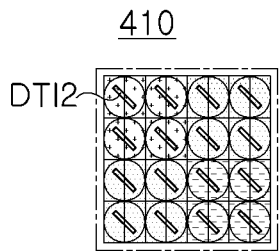
Figure 29C:
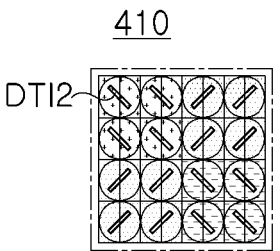
Figure 29D:
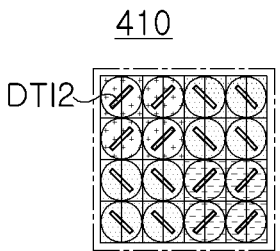
Figure 29E:
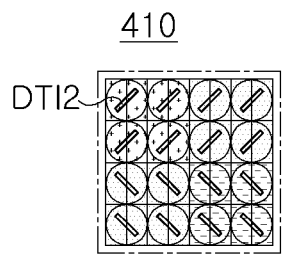
Figure 29F:
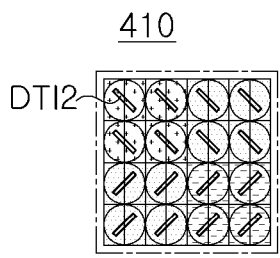
Figure 29G:
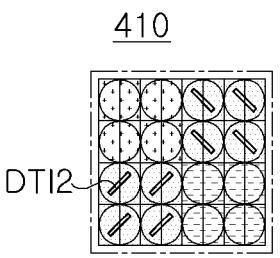
Figure 29H:
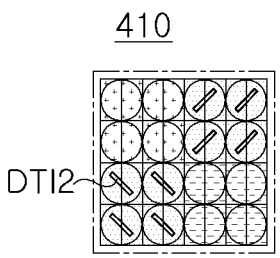

FIG. 28 is a diagram illustrating a pixel array of an image sensor according to an example embodiment. FIGS. 29A to 29P are diagrams illustrating arrangement of second device isolation films included in an image sensor according to an example embodiment.

Referring to FIG. 28, a pixel array 400 may include a plurality of pixel groups PG disposed in a direction parallel to an upper surface of a substrate. Also, each of the plurality of pixel groups PG may include a plurality of pixels PX, and each of the plurality of pixels PX may include a first photodiode and a second photodiode. However, in example embodiments, only a portion of the pixels PX may include the first photodiode and the second photodiode or the arrangement direction of the first photodiode and the second photodiode may be different in at least a portion of the pixels PX.

The pixel array 400 of the image sensor in an example embodiment may include a color filter having an arrangement to generate an image having a Tetra pattern. As an example, the pixel array 400 of the image sensor may have a 4×4 tetra color filter array 410 in which red, green, green, and blue are disposed in a 2×2 form. Each of the plurality of pixel groups PG may include 2×2 pixels PX. In other words, the 2×2 pixels PX included in the plurality of pixel groups PG may include the same color filter. For example, the tetra color filter array 410 repeatedly disposed as above may form the pixel array 400. However, an example embodiment thereof is not limited thereto, and an arrangement of repetitively disposed color filters may be varied.

Referring to FIGS. 29A to 29H, 16 pixels included in the tetra color filter array 410 may include device isolation films DTI2 arranged in a manner similar to the example in FIGS. 27A and 27B. For example, a plurality of pixels included in a single pixel group may include the second device isolation films DTI2 having the same shape and disposed in the same direction. For example, each of the plurality of pixel groups may include first to fourth unit pixels and a second device isolation film disposed on each of the first unit pixels may extend in the same direction. The second device isolation film DTI2 disposed on each of the second unit pixels may extend in a direction different from the direction in which the second device isolation film DTI2 disposed on each of the first unit pixels extends.

Figure 29I:
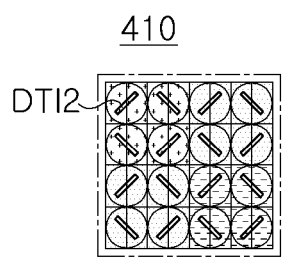
Figure 29J:
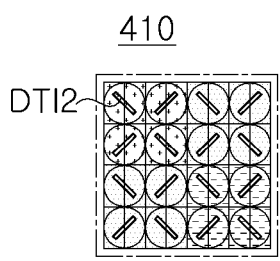

At least a portion of the plurality of pixels included in a single pixel group as illustrated in FIGS. 29I and 29J may include the second device isolation films DTI2 disposed in different directions. As an example, at least one of the plurality of unit pixels included in one of the plurality of pixel groups may include a second device isolation film DTI2 extending in a fourth direction and at least the other one of the plurality of unit pixels may include a second device isolation film DTI2 extending in a fifth direction perpendicular to the fourth direction. In this case, each of the plurality of pixel groups may include pixels including the second device isolation films DTI2 disposed in the same arrangement.

Figure 29K:
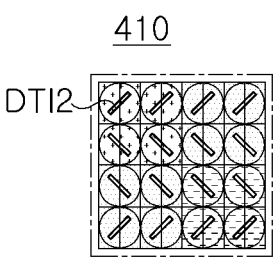
Figure 29L:
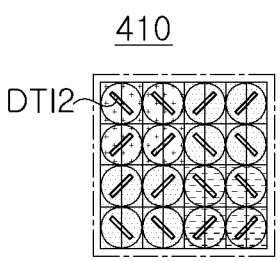
Figure 29M:
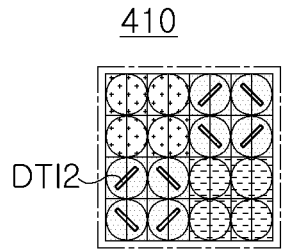
Figure 29N:
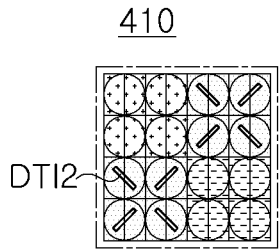
Figure 29O:
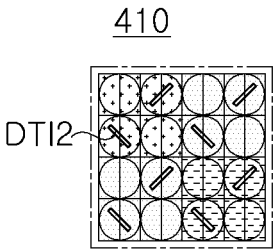
Figure 29P:
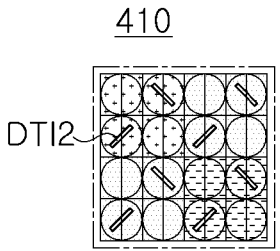

Also, the plurality of pixel groups may include pixels including the second device isolation films DTI2 disposed in different arrangements as in FIGS. 29K and 29L and the pixels disposed below the red and blue color filters may not include the second device isolation films DTI2 as in FIGS. 29M and 29N. As illustrated in FIGS. 29O and 29P, only a portion of the pixels included in a single pixel group may include the second device isolation films DTI2. However, an example embodiment thereof is not limited thereto and the arrangement of the second device isolation films DTI2 may be appropriately configured if desired.

Figure 30:
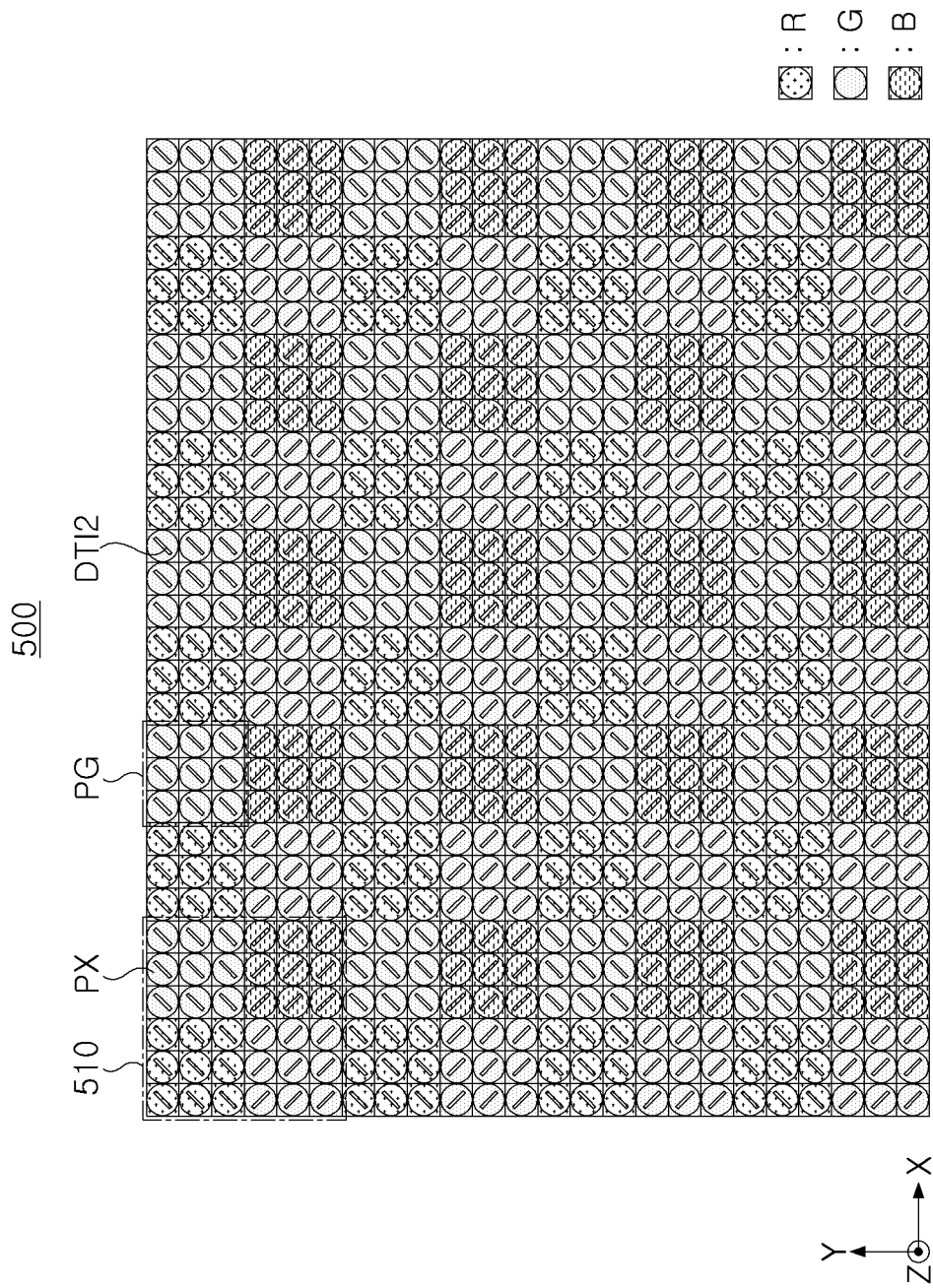
FIG. 30 is a diagram illustrating a pixel array of an image sensor according to an example embodiment of the present disclosure.

FIG. 30 is a diagram illustrating a pixel array of an image sensor according to an example embodiment.

Referring to FIG. 30, a pixel array 500 may include a plurality of pixel groups PG, similarly to the pixel array 400 illustrated in FIG. 28, and each of the plurality of pixel groups PG may include a plurality of pixels PX. The pixels PX included in each of the pixel groups PG may include color filters of the same color. Differently from the pixel array 400 illustrated in FIG. 28, each of the plurality of pixel groups PG included in the pixel array 500 may include pixels PX in a 3×3 form. In other words, the pixel array 500 of the image sensor in an example embodiment may include a color filter having an arrangement to generate an image having a Nona pattern. As an example, the pixel array 500 of the image sensor may have a 6×6 Nona color filter array 510 in which red, green, green, and blue are disposed in a 2×2 form. However, an example embodiment thereof is not limited thereto, and the arrangement of repetitively disposed color filters may be varied.

In the example embodiments described with reference to FIGS. 26 to 30, autofocusing performance of the image sensor may be maintained or may improve by the second device isolation film DTI2 configured to overlap a portion of at least one of the first photodiode and the second photodiode. Further, the pixels PX included in the pixel arrays 300, 400, and 500 illustrated in FIGS. 26 to 30 may include the pixels illustrated in FIGS. 3 and/or 12. Accordingly, the autofocusing performance may increase in consideration of the form of the pixels and the arrangement on the pixel array.

Figure 31:
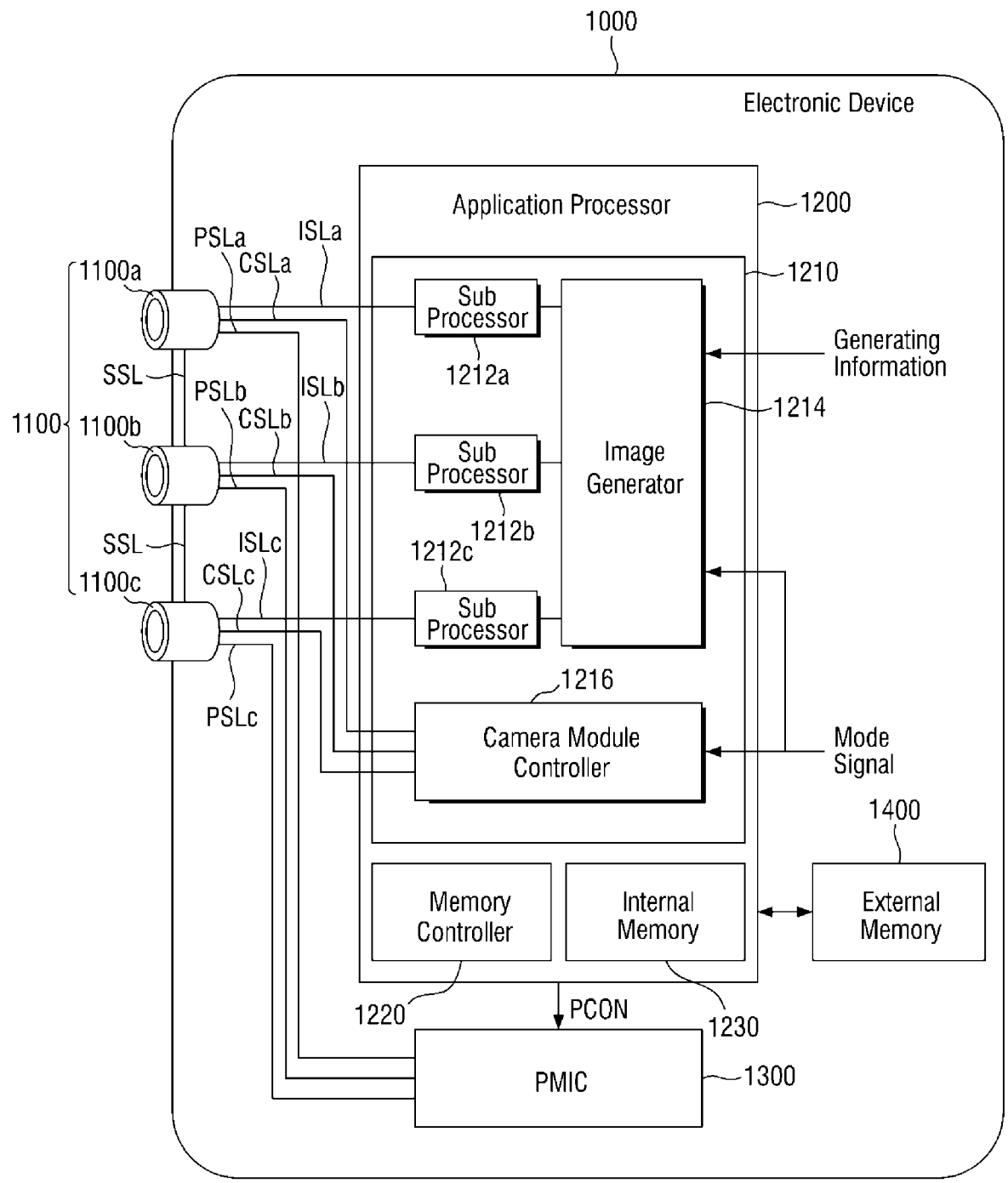
FIGS. 31 and 32 are diagrams illustrating an electronic device including an image sensor according to an example embodiment of the present disclosure.
Figure 32:
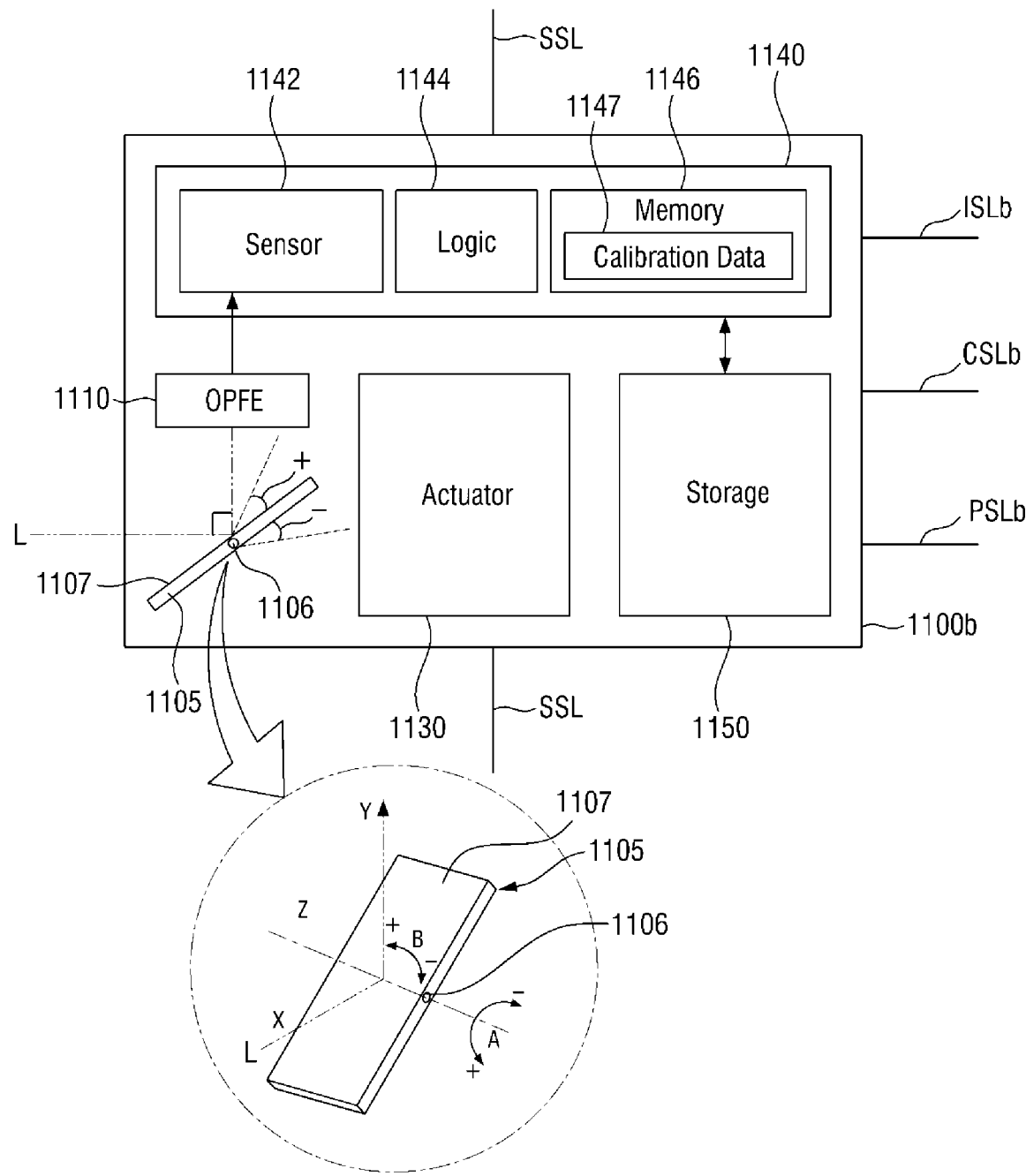

FIGS. 31 and 32 are diagrams illustrating an electronic device including an image sensor according to an example embodiment.

Referring to FIG. 31, the electronic device 1000 may include a camera module group 1100, an application processor 1200, a PMIC 1300, and an external memory 1400.

The camera module group 1100 may include a plurality of camera modules 1100a, 1100b, and 1100c. FIG. 31 illustrates the example embodiment in which three camera modules 1100a, 1100b, and 1100c are disposed, but an example embodiment thereof is not limited thereto. In example embodiments, the camera module group 1100 may be modified to include only two camera modules. Also, in example embodiments, the camera module group 1100 may be modified to include n (n is a natural number of 4 or greater) number of camera modules. Further, in an example embodiment, at least one of the plurality of camera modules 1100a, 1100b, and 1100c included in the camera module group 1100 may include the image sensor described in one of the aforementioned example embodiments with reference to FIGS. 1 to 30.

In the description below, a detailed configuration of the camera module 1100b will be described in greater detail with reference to FIG. 32, and the following description may also be applied to the other camera modules 1100a and 1100b according to an example embodiment.

Referring to FIG. 32, the camera module 1100b may include a prism 1105, an optical path folding element (hereinafter, "OPFE") 1110, an actuator 1130, an image sensing device 1140, and a storage unit 1150.

The prism 1105 may include a reflective surface 1107 of a light reflecting material and may change a path of the light L incident from the outside.

In example embodiments, the prism 1105 may change the path of the light L incident in the first direction X in the second direction Y perpendicular to the first direction X. Also, the prism 1105 may rotate the reflective surface 1107 of the light reflective material in the direction A around a central shaft 1106, or may rotate the central axis 1106 in the direction B such that the path of light L incident in the first direction X may change in the second direction Y, a perpendicular direction. In this case, the OPFE 1110 may also move in a third direction Z perpendicular to the first direction X and the second direction Y.

In example embodiments, as illustrated in the drawings, a maximum rotational angle of the prism 1105 in the A direction may be 15 degrees or less in the positive (+) A direction, and may be greater than 15 degrees in the negative (−) A direction. However, an example embodiment thereof is not limited thereto.

In example embodiments, the prism 1105 may move by about 20 degrees, by 10 degrees to 20 degrees, or by 15 degrees to 20 degrees in the positive (+) or negative (−) B direction, where, as for the angle of the movement, the prism 1105 may move by the same angle or may move by almost the same angle within 1 degree in the positive (+) or negative (−) B direction.

In example embodiments, the prism 1105 may move the reflective surface 1106 of a light reflective material in a third direction (e.g., the Z direction) parallel to the extending direction of the central axis 1106.

The OPFE 1110 may include, for example, an optical lens consisting of m (where m is a natural number) number of groups. The m number of lenses may move in the second direction Y and may change an optical zoom ratio of the camera module 1100b. For example, when a basic optical zoom magnification of the camera module 1100b is Z, and m number of optical lenses included in the OPFE 1110 move, the optical zoom magnification of the camera module 1100b may change to an optical zoom magnification of 3Z, 5Z, or 5Z or higher.

The actuator 1130 may move the OPFE 1110 or an optical lens to a specific position. For example, the actuator 1130 may adjust the position of the optical lens such that the image sensor 1142 may be disposed at a focal length of the optical lens to perform accurate sensing.

The image sensing device 1140 may include an image sensor 1142, a control logic 1144, and a memory 1146. The image sensor 1142 may sense an image of a sensed object using the light L provided through the optical lens. The control logic 1144 may control overall operation of the camera module 1100b. For example, the control logic 1144 may control operation of the camera module 1100b in response to a control signal provided through the control signal line CSLb.

The memory 1146 may store information necessary for the operation of the camera module 1100b, such as calibration data 1147. The calibration data 1147 may include information necessary for the camera module 1100b to generate image data using the light L provided from the outside. The calibration data 1147 may include, for example, information on a degree of rotation, information on a focal length, information on an optical axis, and the like, described above. When the camera module 1100b is implemented in the form of a multi-state camera of which a focal length changes depending on the position of the optical lens, the calibration data 1147 may include information on a focal length value at each position (or in each state) of the optical lens and an autofocusing operation.

The storage unit 1150 may store image data sensed through the image sensor 1142. The storage unit 1150 may be disposed externally on the image sensing device 1140 and may be implemented in a stacked form with a sensor chip included in the image sensing device 1140. In example embodiments, the storage unit 1150 may be implemented as an electrically erasable programmable read-only memory (EEPROM), but an example embodiment thereof is not limited thereto.

Referring to FIGS. 31 and 32, in example embodiments, each of the plurality of camera modules 1100a, 1100b, and 1100c may include an actuator 1130. Accordingly, each of the plurality of camera modules 1100a, 1100b, and 1100c may include the same or different calibration data 1147 according to operation of the actuator 1130 included therein.

In example embodiments, one camera module (e.g., the camera module 1100b) among the plurality of camera modules 1100a, 1100b, and 1100c may be implemented as a folded-lens type camera module including the prism 1105 and the OPFE 1110 described above, and the other camera modules (e.g., the camera modules 1100a and 1100c) may be implemented as a vertical type camera module which does not include prism 1105 and the OPFE 1110, but an example embodiment thereof is not limited thereto.

In example embodiments, one camera module (e.g., the camera module 1100b) among the plurality of camera modules 1100a, 1100b, and 1100c may be implemented as a vertical-type depth camera which may extract depth information using infrared ray (IR). In this case, the application processor 1200 may merge the image data provided by the depth camera with the image data provided by the other camera modules (e.g., the camera module 1100a or 1100c) and may provide a 3D depth image.

In example embodiments, at least two camera modules (e.g., the camera modules 1100a, 1100b) of the plurality of camera modules 1100a, 1100b, and 1100c may have different fields of view. In this case, for example, the optical lenses of at least two camera modules (e.g., the camera modules 1100a, 1100b) of the plurality of camera modules 1100a, 1100b, and 1100c may be different, but an example embodiment thereof is not limited thereto.

Further, in example embodiments, fields of view of the plurality of camera modules 1100a, 1100b, and 1100c may be different from each other. In this case, the optical lenses included in the plurality of camera modules 1100a, 1100b, and 1100c may also be different from each other, but an example embodiment thereof is not limited thereto.

In example embodiments, the plurality of camera modules 1100a, 1100b, and 1100c may be physically isolated from each other. In other words, a sensing area of a single image sensor 1142 may not be divided and used by the plurality of camera modules 1100a, 1100b, and 1100c, but an independent image sensor 1142 may be disposed in each of the plurality of camera modules 1100a, 1100b, and 1100c.

Referring back to FIG. 31, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented separately as separate semiconductor chips.

The image processing device 1210 may include a plurality of sub-image processors 1212a, 1212b, and 1212c, an image generator 1214, and a camera module controller 1216.

The image processing device 1210 may include the plurality of sub-image processors 1212a, 1212b, and 1212c corresponding to the number of camera modules 1100a, 1100b, and 1100c.

Image data generated by each of the camera modules 1100a, 1100b, and 1100c may be provided to the corresponding sub-image processors 1212a, 1212b, and 1212c through separate image signal lines ISLa, ISLb, and ISLc. For example, image data generated by the camera module 1100a may be provided to the sub-image processor 1212a through an image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. The image data transmission may be performed using, for example, a camera serial interface (CSI) based on a mobile industry processor interface (MIPI), but an example embodiment thereof is not limited thereto.

In example embodiments, a single sub-image processor may be disposed to correspond to a plurality of camera modules. For example, the sub-image processor 1212a and the sub-image processor 1212c are not implemented separately from each other as illustrated in the drawing and may be integrated with each other as a single sub-image processor and image data provided by the camera module 1100a and the camera module 1100c may be selected through a selection device (e.g., a multiplexer) and may be provided to the integrated image processor.

The image data provided to each of the sub-image processors 1212a, 1212b, and 1212c may be provided to the image generator 1214. The image generator 1214 may generate an output image using the image data provided by each of the sub-image processors 1212a, 1212b, and 1212c according to the image generating information or a mode signal.

For example, the image generator 1214 may generate an output image by merging at least a portion of the image data generated by the camera modules 1100a, 1100b, and 1100c having different fields of view according to the image generating information or the mode signal. Also, the image generator 1214 may generate an output image by selecting one of pieces of image data generated by camera modules 1100a, 1100b, and 1100c having different fields of view according to the image generating information or the mode signal.

In example embodiments, the image generating information may include a zoom signal or a zoom factor. Further, in example embodiments, the mode signal may be based on a mode selected by a user, for example.

When the image generating information is a zoom signal (zoom factor) and the camera modules 1100a, 1100b, and 1100c have different observational fields of view (fields of view), the image generator 1214 may perform different operations depending on a type of the zoom signal. For example, when the zoom signal is a first signal, an output image may be generated by merging the image data output by the camera module 1100a with the image data output by the camera module 1100c and using the merged image signal and the image data output by the camera module 1100b, which has not been used for the merging. When the zoom signal is a second signal different from the first signal, the image generator 1214 may not perform the image data merging and may generate an output image by selecting one of image data output by each of the camera modules 1100a, 1100*b*, and 1100*c*. However, an example embodiment thereof is not limited thereto, and a method of processing image data may be varied.

In example embodiments, the image generator 1214 may receive a plurality of image data having different exposure times from at least one of the plurality of sub-image processors 1212*a*, 1212*b*, and 1212*c*, and may perform high dynamic range (HDR) processing, thereby generating merged image data with an increased dynamic range.

The camera module controller 1216 may provide a control signal to each of the camera modules 1100*a*, 1100*b*, and 1100*c*. The control signal generated by the camera module controller 1216 may be provided to the corresponding camera modules 1100*a*, 1100*b*, and 1100*c* through control signal lines CSLa, CSLb, and CSLc isolated from each other.

One of the plurality of camera modules 1100*a*, 1100*b*, and 1100*c* may be designated as a master camera (e.g., the camera module 1100*b*) according to image generating information including a zoom signal or the mode signal and the other camera modules (e.g., the camera modules 1100*a* and 1100*c*) may be designated as slave cameras. The above information may be included in the control signal and may be provided to the corresponding camera modules 1100*a*, 1100*b*, and 1100*c* through the control signal lines CSLa, CSLb, and CSLc isolated from each other.

Camera modules operating as masters and slaves may change according to a zoom factor or an operation mode signal. For example, when a field of view of the camera module 1100*a* is wider than that of the camera module 1100*b* and the zoom factor exhibits a low zoom magnification, the camera module 1100*b* may operate as a master and the camera module 1100*a* may operate a slave. Differently from the above example, when the zoom factor exhibits a high zoom magnification, the camera module 1100*a* may operate as a master and the camera module 1100*b* may operate as a slave.

In example embodiments, a control signal provided from the camera module controller 1216 to each of the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may transmit a sync enable signal to the camera module 1100*b*. The camera module 1100*b* receiving the sync enable signal may generate a sync signal based on the provided sync enable signal and may provide the generated sync signal to the camera modules 1100*a* and 1100*c* through a sync signal line SSL. The camera module 1100*b* and the camera modules 1100*a* and 1100*c* may be synchronized with the sync signal and may transmit image data to the application processor 1200.

In example embodiments, a control signal provided from the camera module controller 1216 to the plurality of camera modules 1100*a*, 1100*b*, and 1100*c* may include mode information according to the mode signal. The plurality of camera modules 1100*a*, 1100*b*, and 1100*c* may operate in a first operation mode and a second operation mode in relation to the sensing speed on the basis of the mode information.

In the first operation mode, the plurality of camera modules 1100*a*, 1100*b*, and 1100*c* may generate an image signal at a first rate (e.g., generating an image signal at a first frame rate), may encode the signal at a second rate higher than the first rate (e.g., encoding an image signal having a second frame rate higher than the first frame rate), and may transmit the encoded image signal to the application processor 1200. In this case, the second rate may be 30 times or less the first rate.

The application processor 1200 may store the received image signal, the encoded image signal, in the memory 1230 provided therein or a storage 1400 provided externally of the application processor 1200, may read out the encoded image signal from the memory 1230 or the storage 1400 and may decode the signal, and may display image data generated based on the decoded image signal. For example, a corresponding sub-processor among the plurality of sub-processors 1212*a*, 1212*b*, and 1212*c* of the image processing device 1210 may perform the decoding and may also perform image processing on the decoded image signal.

The plurality of camera modules 1100*a*, 1100*b*, and 1100*c* may generate an image signal at a third rate lower than the first rate in the second operation mode (e.g., generating an image signal of a third frame rate lower than the first frame rate) and may transmit the image signal to the application processor 1200. The image signal provided to the application processor 1200 may not be encoded. The application processor 1200 may perform image processing on the received image signal or may store the image signal in the memory 1230 or the storage 1400.

The PMIC 1300 may supply power, such as a power voltage, to each of the plurality of camera modules 1100*a*, 1100*b*, and 1100*c*. For example, the PMIC 1300 may, under the control of the application processor 1200, supply first power to the camera module 1100*a* through a power signal line PSLa, may supply second power to the camera module 1100*b* through a power signal line PSLb, and may supply third power to the camera module 1100*c* through a power signal line PSLc.

The PMIC 1300 may generate power corresponding to each of the plurality of camera modules 1100*a*, 1100*b*, and 1100*c* in response to a power control signal PCON from the application processor 1200 and may also adjust a level of power. The power control signal PCON may include a power adjustment signal for each operation mode of the plurality of camera modules 1100*a*, 1100*b*, and 1100*c*. For example, the operation mode may include a low power mode, and in this case, the power control signal PCON may include information on a camera module operating in a low power mode and a determined power level. Levels of power provided to the plurality of camera modules 1100*a*, 1100*b*, and 1100*c* may be the same or different. Also, the level of power may be dynamically changed.

According to the aforementioned example embodiments, the image sensor may divide light incident in the left and right directions and also light incident in the vertical direction and the divided light may be incident to the first and second photodiodes. Accordingly, the detection ability for an image in a vertical direction and an image in a horizontal direction may improve such that sensitivity of autofocusing may improve.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like.

The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the example embodiments have been illustrated and described above, it will be apparent to those skilled in the art that modifications and variations could be made without departing from the scope of the present disclosure as defined by the appended claims.

What is claimed is:

1. An image sensor comprising:
a substrate including a first surface and a second surface opposing each other in a first direction and including a plurality of unit pixels arranged in a direction parallel to the first surface;
a first photodiode and a second photodiode disposed in the substrate in each of the plurality of unit pixels and configured to be isolated from each other in a second direction perpendicular to the first direction;
a first device isolation film disposed between the plurality of unit pixels; and
a pixel internal isolation film disposed in at least one of the plurality of unit pixels, wherein:
the pixel internal isolation film includes:
a second device isolation film configured to overlap at least one of the first photodiode and the second photodiode in the first direction, and
a pair of third device isolation films configured to extend from the first device isolation film into the unit pixel in a third direction perpendicular to the first direction and the second direction and to oppose each other.

2. The image sensor of claim 1, wherein a length of the second device isolation film is less than a length of the pair of third device isolation films in the first direction.

3. The image sensor of claim 1, wherein the second device isolation film is configured to extend in a direction intersecting with the second direction and the third direction.

4. The image sensor of claim 3, wherein the pair of third device isolation films are configured to extend in the same direction as an extending direction of the second device isolation film.

5. The image sensor of claim 1, wherein the second device isolation film is configured to be isolated from the first device isolation film.

6. The image sensor of claim 1, wherein:
the second device isolation film includes a first region overlapping at least one of the first photodiode and the second photodiode and a second region disposed between the first photodiode and the second photodiode, and
the first region and the second region are configured to extend in different directions.

7. The image sensor of claim 6, wherein:
the first region includes a first overlap region configured to overlap the first photodiode and a second overlap region configured to overlap the second photodiode, and the first overlap region is configured to be spaced apart from the second overlap region.

8. The image sensor of claim 1, wherein the pair of third device isolation films are disposed between the first photodiode and the second photodiode in the second direction.

9. The image sensor of claim 1, wherein the pair of third device isolation films overlap at least one of the first photodiode and the second photodiode in the first direction.

10. The image sensor of claim 9, wherein the pair of third device isolation films are connected to the second device isolation film.

11. The image sensor of claim 1, wherein:
the first device isolation film and the pair of third device isolation films are configured to extend from the second surface to the first surface, and
the second device isolation film is configured to extend from the first surface and to be isolated from the second surface.

12. An image sensor comprising:
a pixel array including a plurality of pixel groups arranged in a direction parallel to an upper surface of a substrate, wherein each of the plurality of pixel groups includes a plurality of unit pixels; and
a logic circuit configured to obtain a pixel signal from the plurality of unit pixels, wherein:
the plurality of unit pixels are configured to be isolated from each other by a first device isolation film configured to extend in a first direction perpendicular to an upper surface of the substrate,
each of the plurality of unit pixels includes:
a first photodiode and a second photodiode configured to be spaced apart from each other in a second direction perpendicular to the first direction,
a second device isolation film configured to overlap at least one of the first photodiode and the second photodiode,
a color filter disposed on a first surface of the substrate, and
a pixel circuit disposed on a second surface of the substrate,
the plurality of unit pixels included in any one of the plurality of pixel groups include the color filter of the same color, and
at least one of the second device isolation films is configured to extend in a fourth direction, intersecting with the second direction and a third direction perpendicular to the first and second directions.

13. The image sensor of claim 12, wherein each of the plurality of unit pixels further includes a pair of third device isolation films configured to extend from the first device isolation film into the unit pixel.

14. The image sensor of claim 12, wherein each of the plurality of pixel groups includes four or nine unit pixels.

15. The image sensor of claim 14, wherein in at least a part of the plurality of unit pixels included in each of the plurality of pixel groups, the second device isolation films are configured to extend in different directions.

16. The image sensor of claim 15, wherein:
each of the plurality of pixel groups includes first to fourth unit pixels, and
the second device isolation film disposed on each of first unit pixels, among the plurality of unit pixels, is configured to extend in the same direction.

17. The image sensor of claim 16, wherein the second device isolation film disposed on each of second unit pixels, among the plurality of unit pixels, is configured to extend in a direction different from an extending direction of the second device isolation film disposed on each of the first unit pixels.

18. An image sensor comprising:
- a substrate including a first surface and a second surface opposing each other in a first direction and including a plurality of unit pixels arranged in a direction parallel to the first surface;
- a first photodiode and a second photodiode configured to be spaced apart from each other in a second direction perpendicular to the first direction in the substrate;
- a first device isolation film disposed between the plurality of unit pixels each including the first photodiode and the second photodiode; and
- a second device isolation film disposed in at least one of the plurality of unit pixels and configured to overlap a portion of at least one of the first photodiode and the second photodiode in the first direction, wherein:
- the first device isolation film is configured to extend from the second surface to the first surface,
- the second device isolation film is configured to extend from the first surface and to be isolated from the second surface, and
- at least a portion of the second device isolation film is inclined relative to the second direction and a third direction, the third direction being perpendicular to the first and second directions.

19. The image sensor of claim 18, wherein the first device isolation film and the second device isolation film are configured to be spaced apart from each other.

20. The image sensor of claim 18, further comprising a third device isolation film disposed in at least one of the plurality of unit pixels and configured to be connected to the first device isolation film.

\* \* \* \* \*